(12) United States Patent
Fisher et al.

(10) Patent No.: US 12,464,760 B2
(45) Date of Patent: Nov. 4, 2025

(54) BYPASSED GATE TRANSISTORS HAVING IMPROVED STABILITY

(71) Applicant: MACOM Technology Solutions Holdings, Inc., Lowell, MA (US)

(72) Inventors: Jeremy Fisher, Raleigh, NC (US); Khaled Fayed, Cedar Rapids, IA (US); Simon Wood, Raleigh, NC (US)

(73) Assignee: MACOM Technology Solutions Holdings, Inc., Lowell, MA (US)

( * ) Notice: Subject to any disclaimer, the term of this patent is extended or adjusted under 35 U.S.C. 154(b) by 970 days.

(21) Appl. No.: 17/492,032

(22) Filed: Oct. 1, 2021

(65) Prior Publication Data

US 2022/0020874 A1  Jan. 20, 2022

Related U.S. Application Data

(60) Continuation-in-part of application No. 16/907,983, filed on Jun. 22, 2020, now Pat. No. 11,575,037, (Continued)

(51) Int. Cl.
*H10D 30/47* (2025.01)
*H01L 23/522* (2006.01)
*H01L 23/528* (2006.01)
*H10D 62/10* (2025.01)
*H10D 62/824* (2025.01)
(Continued)

(52) U.S. Cl.
CPC ..... *H10D 30/4755* (2025.01); *H01L 23/5228* (2013.01); *H01L 23/5286* (2013.01); *H10D 30/475* (2025.01); *H10D 62/127* (2025.01); *H10D 62/824* (2025.01);
(Continued)

(58) Field of Classification Search
None
See application file for complete search history.

(56) References Cited

U.S. PATENT DOCUMENTS 4,498,093 A   2/1985  Allyn et al.
4,721,986 A   1/1988  Kinzer
(Continued)

FOREIGN PATENT DOCUMENTS

EP   2161754 A2   3/2010
JP   1166564      6/1989
(Continued)

OTHER PUBLICATIONS

"European Search Report in Corresponding European Patent Application No. 22162788.8; Mailing Date Jun. 15, 2022; 10 Pages".
(Continued)

*Primary Examiner* — Grant S Withers
(74) *Attorney, Agent, or Firm* — Myers Bigel, P.A.

(57) ABSTRACT

A transistor device includes a plurality of gate fingers that extend in a first direction and are spaced apart from each other in a second direction, each of the gate fingers comprising at least spaced-apart and generally collinear first and second gate finger segments that are electrically connected to each other. The first gate finger segments are separated from the second gate finger segments in the first direction by a gap region that extends in the second direction. A resistor is disposed in the gap region.

18 Claims, 20 Drawing Sheets

Related U.S. Application Data which is a continuation of application No. 16/182,642, filed on Nov. 7, 2018, now Pat. No. 10,692,998, which is a division of application No. 15/587,830, filed on May 5, 2017, now Pat. No. 10,128,365, which is a continuation-in-part of application No. 15/073,201, filed on Mar. 17, 2016, now Pat. No. 9,786,660.

(51) Int. Cl.
  *H10D 62/85*   (2025.01)
  *H10D 64/23*   (2025.01)
  *H10D 64/27*   (2025.01)

(52) U.S. Cl.
  CPC ....... *H10D 62/8503* (2025.01); *H10D 64/257* (2025.01); *H10D 64/411* (2025.01)

(56) References Cited

U.S. PATENT DOCUMENTS

| | | | |
|---|---|---|---|
| 5,025,296 | A | 6/1991 | Fullerton et al. |
| 5,416,342 | A | 5/1995 | Edmond et al. |
| 5,500,522 | A | 3/1996 | Eshraghian et al. |
| 5,523,589 | A | 6/1996 | Edmond et al. |
| 5,592,006 | A | 1/1997 | Merrill |
| 5,604,135 | A | 2/1997 | Edmond et al. |
| 5,631,190 | A | 5/1997 | Negley |
| 5,739,554 | A | 4/1998 | Edmond et al. |
| 5,912,477 | A | 6/1999 | Negley |
| 6,020,613 | A | 2/2000 | Udomoto et al. |
| 6,023,086 | A | 2/2000 | Reyes et al. |
| 6,120,600 | A | 9/2000 | Edmond et al. |
| 6,187,606 | B1 | 2/2001 | Edmond et al. |
| 6,201,262 | B1 | 3/2001 | Edmond et al. |
| 6,245,259 | B1 | 6/2001 | Hoehn et al. |
| 6,274,896 | B1 | 8/2001 | Gibson et al. |
| 6,316,793 | B1 | 11/2001 | Sheppard et al. |
| 6,507,047 | B2 | 1/2003 | Litwin |
| 6,635,503 | B2 | 10/2003 | Andrews et al. |
| 6,765,268 | B2 | 7/2004 | Akamine et al. |
| 6,900,482 | B2 | 5/2005 | Aoki et al. |
| 7,135,747 | B2 | 11/2006 | Allen et al. |
| 7,851,832 | B2 | 12/2010 | Takagi |
| 7,906,799 | B2 | 3/2011 | Sheppard et al. |
| 8,525,190 | B2 | 9/2013 | Donofrio et al. |
| 8,536,622 | B2 | 9/2013 | Hosoda et al. |
| 8,796,697 | B2 | 8/2014 | Kunii et al. |
| 8,860,093 | B2 | 10/2014 | Sasaki et al. |
| 8,866,197 | B2 | 10/2014 | Becker et al. |
| 2001/0012671 | A1 | 8/2001 | Hoshino et al. |
| 2002/0033508 | A1 | 3/2002 | Morikawa et al. |
| 2002/0039038 | A1 | 4/2002 | Miyazawa |
| 2002/0066908 | A1 | 6/2002 | Smith |
| 2002/0140024 | A1 | 10/2002 | Aoki et al. |
| 2002/0167023 | A1 | 11/2002 | Chavarkar et al. |
| 2003/0102482 | A1 | 6/2003 | Saxler |
| 2004/0061129 | A1 | 4/2004 | Saxler et al. |
| 2006/0081985 | A1 | 4/2006 | Beach et al. |
| 2008/0100404 | A1 | 5/2008 | Vice |
| 2008/0157222 | A1 | 7/2008 | Wang |
| 2009/0020848 | A1 | 1/2009 | Ono et al. |
| 2009/0108357 | A1 | 4/2009 | Takagi |
| 2009/0212846 | A1 | 8/2009 | Cutter |
| 2011/0018631 | A1 | 1/2011 | Ng et al. |
| 2011/0102077 | A1 | 5/2011 | Lamey et al. |
| 2011/0284928 | A1 | 11/2011 | Shibata et al. |
| 2012/0012908 | A1 | 1/2012 | Matsunaga |
| 2012/0012945 | A1 | 1/2012 | Inoue |
| 2012/0199847 | A1 | 8/2012 | Takagi |
| 2012/0267795 | A1 | 10/2012 | Tadayuki |
| 2013/0099286 | A1 | 4/2013 | Imada |
| 2013/0109168 | A1 | 5/2013 | Kiyoshi |
| 2013/0228787 | A1 | 9/2013 | Yamamura |
| 2013/0313653 | A1 | 11/2013 | Brech |
| 2014/0014969 | A1 | 1/2014 | Kunii et al. |
| 2014/0102077 | A1 | 4/2014 | Riffle et al. |
| 2015/0129965 | A1 | 5/2015 | Roy et al. |
| 2017/0271329 | A1 | 9/2017 | Farrell et al. |
| 2018/0047656 | A1* | 2/2018 | Mkhitarian ......... H01L 23/4824 |
| 2019/0245047 | A1 | 8/2019 | Tomomatsu et al. |
| 2022/0020874 | A1 | 1/2022 | Fisher et al. |

FOREIGN PATENT DOCUMENTS

| | | |
|---|---|---|
| JP | 2110943 | 4/1990 |
| JP | 1145891 | 2/1999 |
| JP | H1145891 A | 2/1999 |
| JP | H11297849 A | 10/1999 |
| JP | 2001094094 A | 4/2001 |
| JP | 2002094054 | 3/2002 |
| JP | 2002094054 A | 3/2002 |
| JP | 2002299351 A | 10/2002 |
| JP | 2004096119 A | 3/2004 |
| JP | 2004336445 | 11/2004 |
| JP | 2004336445 A | 11/2004 |
| JP | 2008258369 A | 10/2008 |
| JP | 2009111016 A | 5/2009 |
| JP | 2012182438 | 9/2012 |
| JP | 2012182438 A | 9/2012 |
| JP | 2012227437 A | 11/2012 |
| TW | 533579 B | 5/2003 |
| WO | 2016042861 | 3/2016 |
| WO | 2016042861 A1 | 3/2016 |
| WO | 2018204622 A1 | 11/2018 |

OTHER PUBLICATIONS

"Data Sheet for Cree CGH60120D Gallium Nitride (GaN) High Electron Mobility Transistor (HEMT) Device (Admitted Prior Art)".

"Notification of Transmittal of the International Search Report and the Written Opinion of the International Searching Authority, or the Declaration, for International Application No. PCT/US18/30863; mailing date: Sep. 7, 2018, 17 pp."

"Office Action issued in connection with corresponding Japanese Application No. 2018-548833 (including English translation), mailed Sep. 20, 2019 (11 pages)".

"Office Action issued in connection with corresponding Korean Application No. 10-2018-7028471 (including English translation), mailed Oct. 28, 2019 (8 pages)".

"Office Action issued in corresponding Japanese Application No. 2018-548833, mailed Feb. 4, 2020 (including English translation)."

"PCT Notification Concerning Transmittal of International Preliminary Report on Patentability, issued on Nov. 14, 2019 for corresponding International Application No. PCT/US2018/030863 (13)".

Extended European Search Report dated Dec. 15, 2020, issued in corresponding European Application No. 18795054.

Japanese Office Action dated Dec. 10, 2020, issued in corresponding Japanese Application No. 2019-560218.

"Japanese Office Action in corresponding patent application No. 2021131203, mailed Sep. 13, 2022, 3 pages".

"Notification of Transmittal of the International Search Report and the Written Opinion of the International Searching Authority, or the Declaration for corresponding International Application No. PCT/US2024/019002, mailing date: Sep. 12, 2024, (22 pages)".

"Notification of First Office Action for corresponding Chinese Application No. 201880029743.8, dated Oct. 3, 2022, 8 pages".

"Invitation to Pay Additional Fees and, Where Applicable, Protest Fee", International Application No. PCT/US2024/019002, Jul. 22, 2024, 15 pp.

"Japanese Office Action in Corresponding Patent Application No. 2022-059193, mailed Jun. 1, 2023, 3 pages".

"International Search Report and Written Opinion for International Patent Application No. PCTUS22075500, mailed Feb. 13, 2023, 21 pages".

* cited by examiner

BYPASSED GATE TRANSISTORS HAVING IMPROVED STABILITY

CROSS-REFERENCE TO RELATED APPLICATIONS

The present application is a continuation-in-part of U.S. patent application Ser. No. 16/907,983, filed Jun. 22, 2020, which in turn is a continuation of U.S. patent application Ser. No. 16/182,642 filed Nov. 7, 2018, which claims priority under 35 U.S.C. § 120 as a divisional of U.S. patent application Ser. No. 15/587,830, filed May 5, 2017, which in turn claims priority under 35 U.S.C. § 120 as a continuation-in-part of U.S. patent application Ser. No. 15/073,201, filed Mar. 17, 2016, the entire content of each of which is incorporated by reference herein.

FIELD

The inventive concepts described herein relate to microelectronic devices and, more particularly, to high power, high frequency transistors having unit cell-based structures.

BACKGROUND

Electrical circuits requiring high power handling capability while operating at high frequencies, such as radio frequencies (500 MHz), S-band (3 GHz) and X-band (10 GHz), have in recent years become more prevalent. Because of the increase in high power, high frequency circuits, there has been a corresponding increase in demand for transistors which are capable of reliably operating at radio and microwave frequencies while still being capable of handling higher power loads.

To provide increased output power, transistors with larger gate peripheries have been developed. One technique for increasing the effective gate periphery of a transistor is to provide a plurality of transistor cells that are connected in parallel. For example, a high power transistor may include a plurality of gate fingers that extend in parallel between respective elongated source and drain contacts, as illustrated in FIG. 1.

In particular, FIG. 1 illustrates a metal layout of a conventional transistor structure 10 that includes a gate pad 12, a source pad 22 and a drain pad 32 on a semiconductor structure 20. FIG. 1 is a plan view of the device (i.e., looking down at the device from above). As shown in FIG. 1, in the conventional transistor 10, the gate pad 12 is connected by a gate bus 14 to a plurality of gate fingers 16 that extend in parallel in a first direction (e.g., the y-direction indicated in FIG. 1). The source pad 22 is connected to a plurality of parallel source contacts 26 via a source bus 24, and the drain pad 32 is connected to a plurality of drain contacts 36 via a drain bus 34. Each gate finger 16 runs along the y-direction between a pair of adjacent source and drain contacts 26, 36. A unit cell of the transistor 10 is illustrated at box 40, and includes a gate finger 16 that extends between adjacent source and drain contacts 26, 36. The "gate length" refers to the distance of the gate metallization in the x-direction, while the "gate width" is the distance by which the source and drain contacts 26, 36 overlap in the y-direction. That is, "width" of a gate finger 16 refers to the dimension of the gate finger 16 that extends in parallel to the adjacent source/drain contacts 26, 36 (the distance along the y-direction). The gate periphery of the device refers to the sum of the gate widths for each gate finger 16 of the device 10.

In addition to adding unit cells, the gate periphery of a multi-cell transistor device may be increased by making the gate fingers wider (i.e., longer in the y-direction). As the gate fingers of a device become wider, however, the high frequency performance of the device may be adversely impacted. In addition, making the gate fingers wider typically means that the gate fingers must handle increased current densities, which can cause electromigration of the gate finger metallization.

SUMMARY

A transistor device according to some embodiments includes a source contact extending in a first direction, a gate finger extending in the first direction adjacent the source contact, and a drain contact adjacent the gate finger. The gate finger is between the drain contact and the source contact. A gate pad is electrically connected to the gate finger at a plurality of points along the gate finger.

The device further includes a gate jumper that extends in the first direction and that is conductively connected to the gate pad. The gate pad is conductively connected through the gate jumper to at least one of the plurality of points along the gate finger.

The device may further include a gate bus connected to the gate jumper and the gate finger, and a gate signal distribution bar that is spaced apart from the gate bus in the first direction and that connects the gate jumper to the gate finger.

A transistor device according to further embodiments includes a gate pad, a gate finger in conductive contact with the gate pad at a first location on the gate finger and extending in a first direction, and a gate jumper in conductive contact with the gate pad and extending in the first direction. The gate jumper is conductively connected to the gate finger at a second location on the gate finger that is spaced apart from the first location so that a gate signal received at the gate pad is applied to the gate finger at the first location and at the second location.

A transistor device according to further embodiments includes a gate bus, a gate finger in contact with the gate bus and extending in a first direction, and a gate jumper in contact with the gate bus and extending in the first direction, wherein the gate jumper is in conductive contact with the gate finger at a location along the gate finger that is spaced apart from the gate bus in the first direction.

A transistor device according to further embodiments includes a substrate, a gate bus on the substrate, and first and second source contact segments on the substrate and extending in a first direction. The first and second source contact segments are separated from one another in the first direction by a gap. The device further includes a gate finger on the substrate and connected to the gate bus. The gate finger extends in the first direction adjacent the source contact segments. The device further includes a drain contact on the substrate adjacent the gate finger, wherein the gate finger is between the drain contact and the source contact segments, a gate jumper connected to the gate bus, wherein the gate jumper is provided over the source contact segments and extends in the first direction, and a gate signal distribution bar on the substrate and extending from the gap between the first and second source contact segments to the gate finger. The gate signal distribution bar contacts the gate finger at a gate signal distribution point that is spaced apart from the gate bus in the first direction, and the gate signal distribution bar is conductively connected to the gate jumper.

A transistor according to further embodiments includes a drain contact extending along a first axis, a source contact extending along a second axis that is parallel to the first axis, a gate finger extending between the source contact and the drain contact, and a plurality of spaced-apart gate resistors that are electrically connected to the gate finger. At least a first of the gate resistors is disposed in a portion of a region between the first axis and the second axis that is between a first end and a second end of the gate finger when the transistor is viewed from above.

In some embodiments, the gate finger may include a plurality of discontinuous, collinear gate finger segments that are electrically connected to each other. The transistor may further include a gate jumper that is electrically connected between a gate bus and a first of the gate finger segments. The first of the gate resistors may be interposed along an electrical path between the gate jumper and a first of the gate finger segments. The transistor may also include a first gate signal distribution bar that is interposed along an electrical path between the gate jumper and the first of the gate finger segments. The first of the gate resistors may be interposed along an electrical path between the first gate signal distribution bar and the first of the gate finger segments. Each gate finger segment may be part of a respective gate split, and the transistor may further include an odd mode resistor that is positioned between two adjacent gate splits.

In some embodiments, the source contact includes a plurality of collinear discontinuous source contact segments, and the gate jumper extends over the source contact. A first gate signal distribution bar may extend in a gap between two adjacent source contact segments. The odd mode resistor may be interposed between the first gate signal distribution bar and a second gate signal distribution bar that is collinear with the first gate signal distribution bar. Moreover, the transistor may include a second source contact that includes a plurality of collinear discontinuous source contact segments that does not have a gate jumper extending over it, and the odd mode resistor may be between two adjacent ones of the source contact segments of this second source contact.

A transistor according to still further embodiments includes a source contact extending in a first direction, a gate jumper extending in the first direction and a gate finger that comprises a plurality of discontinuous gate finger segments which may be collinear with each other. The transistor further includes a plurality of spaced-apart gate resistors that are electrically connected to the gate jumper. A first of the gate finger segments is connected to the gate jumper through a first of the gate resistors.

In some embodiments, the source contact includes a plurality of discontinuous source contact segments, and the first of the gate resistors is in a gap between two adjacent source contact segments. The gate jumper may extend over at least some of the source contact segments. The transistor may further include a drain contact extending in the first direction adjacent the gate finger so that the gate finger extends between the source contact and the drain contact, a second gate finger that comprises a plurality of discontinuous and collinear gate finger segments that extend in the first direction so that the drain contact extends between the gate finger and the second gate finger, and a second source contact that includes a plurality of discontinuous source contact segments that extends in the first direction adjacent the second gate finger. An odd-mode resistor may be provided in a gap between two adjacent source contact segments of the second source contact.

A gate signal distribution bar may extend between the gate jumper and a first of the gate finger segments of the first gate finger and between the gate jumper and a first of the gate finger segments of the second gate finger. The gate signal distribution bar may be located in a gap between two adjacent source contact segments of the source contact. The odd-mode resistor may be connected between the gate signal distribution bar and a second gate signal distribution bar that connects gate finger segments of a plurality of additional gate fingers to a second gate jumper.

A transistor according to further embodiments includes a plurality of gate fingers that extend in a first direction and are spaced apart from each other in a second direction that is perpendicular to the first direction. Each of the gate fingers comprises at least spaced-apart and generally collinear first and second gate finger segments, where the first gate finger segments are separated from the second gate finger segments in the first direction by a gap region that extends in the second direction. A resistor is disposed in the gap region.

In some embodiment, the transistor further includes a plurality of source contacts that extend in the first direction, each source contact including a plurality of discontinuous source contact segments, and each source contact extending between the gate fingers of respective pairs of the gate fingers and a plurality of drain contacts that extend in the first direction, each drain contact extending between the respective pairs of the gate fingers. A gate bus may be electrically connected to the gate fingers and a gate jumper may be electrically connected to the gate bus, where the gate jumper is interposed along an electrical path between and at least some of the gate finger segments and the gate bus.

In some embodiments, the resistor may be an odd mode resistor that is positioned between two adjacent ones of the source contact segments of one of the source contacts. In other embodiments, the resistor may be a gate resistor that is interposed along an electrical path between the gate jumper and the first gate finger segment of a first of the gate fingers. In these embodiments, the gate resistor may be interposed along a first gate signal distribution bar that extends between the gate jumper and the first gate finger segment of a first of the gate fingers.

Pursuant to further embodiments of the present invention, transistors are provided that comprise a semiconductor layer structure. A source contact, a drain contact and a gate finger are formed on an upper surface of the semiconductor layer structure, with the gate finger positioned between the source contact and the drain contact. These transistors further comprise a gate jumper that is positioned above and over the source contact that is electrically connected to at least a portion of the gate finger. The source contact extends continuously on the upper surface of the semiconductor layer structure without any gaps that divide the source contact into segments.

In some embodiments, the gate finger may comprise a plurality of discontinuous gate finger segments.

In some embodiments, the transistor may further comprise a gate bus, where at least one of the discontinuous gate finger segments is electrically connected to the gate bus through the gate jumper.

In some embodiments, the source contact may be on a first major surface of the semiconductor layer structure, and the transistor may further comprise a source bus layer on a second major surface of the semiconductor layer structure and a plurality of source contact plugs that extend through the semiconductor layer structure to electrically connect the source contact to the source bus layer.

In some embodiments, the source contact may include at least a first widened portion, a second widened portion and narrowed portion that physically and electrically connects the first widened portion to the second widened portion. The first and second widened portions may be wider than the narrowed portion in a direction that is perpendicular to a longitudinal axis of the source contact and that is parallel to a lower surface of the semiconductor layer structure.

In some embodiments the transistor may further comprise a gate signal distribution bar that is at a same height above the semiconductor layer structure as the gate jumper, the gate signal distribution bar extending from the gate jumper towards the gate finger. In some embodiments, the gate signal distribution bar is interposed on an electrical path between the gate jumper and at least a portion of the gate finger. In some embodiments, the gate signal distribution bar may be electrically connected to the gate finger by a conductive via.

In some embodiments, the transistor may further comprise a series gate resistor that is interposed on an electrical path that connects the gate bus to the gate signal distribution bar.

In some embodiments, a longitudinal axis of the source contact, a longitudinal axis of the drain contact and a longitudinal axis of the gate finger each extend in the first direction.

Pursuant to further embodiments of the present invention, transistors are provided that comprise a semiconductor layer structure, a source contact that extends in a first direction on an upper surface of the semiconductor layer structure, a drain contact that extends in the first direction on the upper surface of the semiconductor layer structure, and a gate finger that extends in the first direction on the upper surface of the semiconductor layer structure, the gate finger positioned between the source contact and the drain contact. One of the source contact and the drain contact includes, on the upper surface of the semiconductor layer structure, first and second widened portions that are physically and electrically connected to each other by a narrowed portion.

In some embodiments, the source contact may include the first and second widened portions and the narrowed portion. The first and second widened portions may be wider than the narrowed portion in a direction that is perpendicular to a longitudinal axis of the source contact and that is parallel to a lower surface of the semiconductor layer structure.

In some embodiments, the transistor may further comprise a gate bus and a gate jumper that is electrically connected to the gate bus, wherein the gate jumper is positioned above and over the source contact, and at least a portion of the gate finger may be electrically connected to the gate bus through the gate jumper.

In some embodiments, the gate finger may be a plurality of discontinuous gate finger segments.

In some embodiments, the transistor may further comprise a gate signal distribution bar that is formed in a same metal layer as the gate jumper, the gate signal distribution bar extending from the gate jumper towards the gate finger. In some embodiments, the gate signal distribution bar may be electrically connected to at least a portion of the gate finger by a vertical contact plug.

In some embodiments, a plane that is perpendicular to a longitudinal axis of the gate jumper and perpendicular to a plane defined by the bottom surface of the semiconductor layer structure may extend through both the narrowed portion of the source contact and the vertical contact plug.

In some embodiments, the transistor may further comprise a series gate resistor that is interposed on an electrical path that connects the gate bus to the gate signal distribution bar.

In some embodiments, the transistor may further comprise a source bus layer and a plurality of source contact plugs that electrically connect the source contact to the source bus layer.

In some embodiments, a first of the discontinuous gate finger segments may be electrically connected to the gate bus through a series gate resistor and may not be electrically connected to the gate bus through the gate jumper.

Pursuant to still further embodiments of the present invention, transistors are provided that comprise a semiconductor layer structure, a source contact that extends in a first direction on an upper surface of the semiconductor layer structure, a drain contact that extends in the first direction on the upper surface of the semiconductor layer structure, a gate finger that extends in the first direction on the upper surface of the semiconductor layer structure, the gate finger positioned between the source contact and the drain contact and comprising a plurality of discontinuous gate finger segments, a gate bus, a gate jumper that is electrically connected to the gate bus, wherein the gate jumper has a longitudinal axis that extends in the first direction and is positioned above the source contact, and a gate signal distribution bar that is formed in a same metal layer as the gate jumper, the gate signal distribution bar extending from the gate jumper towards a first of the discontinuous gate finger segments.

In some embodiments, the source contact includes, on the upper surface of the semiconductor layer structure, first and second widened sections that are physically and electrically connected to each other by a narrowed section, and wherein the gate jumper is positioned above the source contact and a first of the discontinuous gate finger segments is electrically connected to the gate bus through the gate jumper.

In some embodiments, the gate signal distribution bar may be electrically connected to the first of the discontinuous gate finger segments by a vertical contact plug.

In some embodiments, a plane that is perpendicular to a longitudinal axis of the gate jumper and perpendicular to a plane defined by the bottom surface of the semiconductor layer structure may extend through both the narrowed section of the source contact and the vertical contact plug.

In some embodiments, the transistor may further comprise a series gate resistor that is interposed on an electrical path that connects the gate bus to the gate signal distribution bar. In some embodiments, the series gate resistor may be implemented as part of the gate jumper.

In some embodiments, the transistor may further comprise a series gate resistor that is interposed on an electrical path that connects the gate bus to the gate signal distribution bar.

In some embodiments, a second of the discontinuous gate finger segments may be electrically connected to the gate bus through a series gate resistor and may not be electrically connected to the gate bus through the gate jumper.

BRIEF DESCRIPTION OF THE DRAWINGS

The accompanying drawings, which are included to provide a further understanding of the invention and are incorporated in and constitute a part of this application, illustrate certain embodiment(s) of the invention. In the drawings.

DETAILED DESCRIPTION

Figure 1:
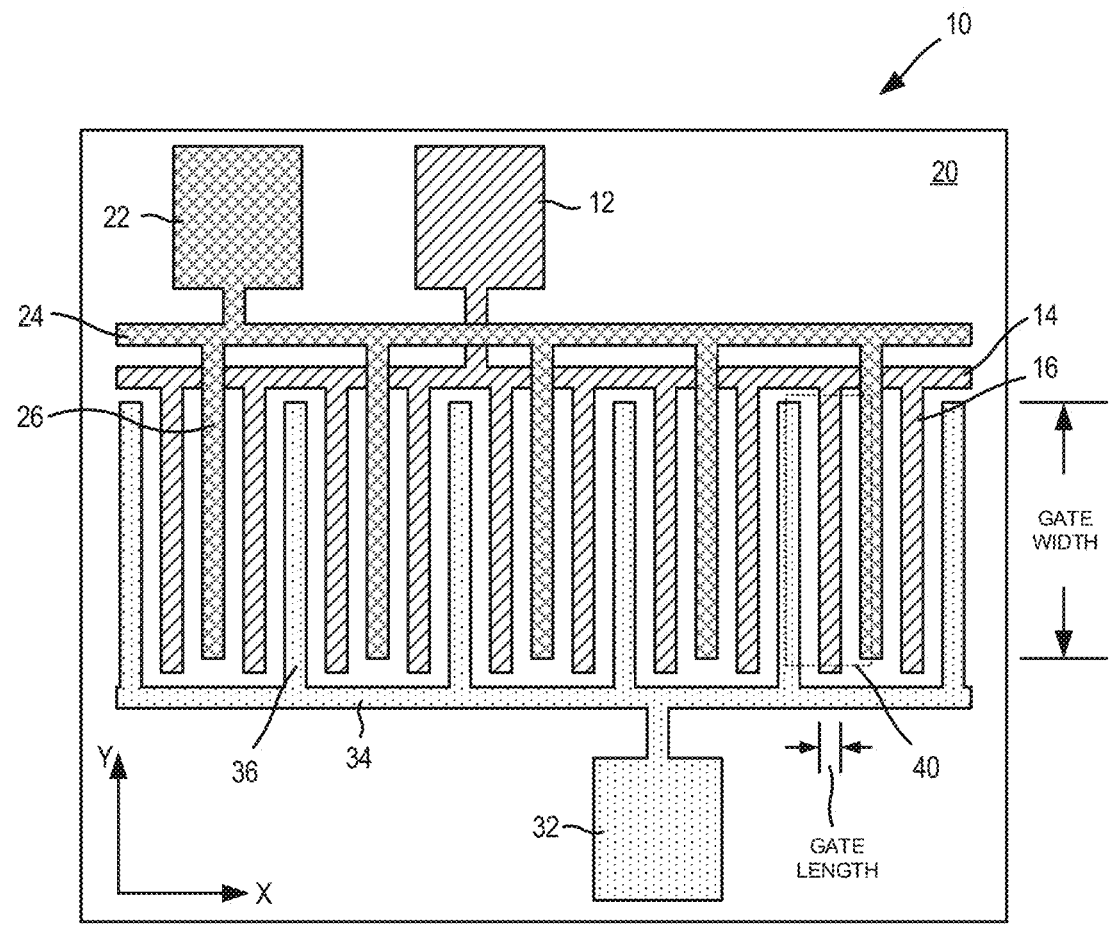
FIG. 1 is a plan view of a metal layout of a conventional multi-cell transistor.

Embodiments of the present inventive concepts are described more fully hereinafter with reference to the accompanying drawings, in which embodiments of the invention are shown. This inventive concepts may, however, be embodied in many different forms and should not be construed as limited to the embodiments set forth herein. Rather, these embodiments are provided so that this disclosure will be thorough and complete, and will fully convey the scope of the inventive concepts to those skilled in the art. Like numbers refer to like elements throughout.

Embodiments of the inventive concepts provide multi-cell transistor devices with large effective gate widths. By feeding the gate signal to the gate fingers at multiple locations along the width of the gate finger, the high frequency gain performance of the transistor may be improved, and electromigration concerns that are normally associated with wide gate fingers can be reduced. According to some embodiments, a larger gate width of a multi-cell transistor device can be accommodated by adding a second layer of metal over the source regions of a unit cell to act as a gate jumper. The gate jumper is connected to the gate finger at various locations along the gate finger, effectively dividing the gate finger into multiple segments. The gate jumper may be provided by a second layer of metal that extends over and above the source contact that connects the gate pad to the gate segments. In some embodiments, the gate jumper could extend over and above the drain contact or the gate finger instead of over and above the source contact.

By effectively dividing the gate finger into segments and distributing the gate signal to each of the gate finger segments by means of a gate jumper, the gain performance of the transistor may be improved and electromigration concerns can be alleviated.

Thus, embodiments of the inventive concepts provide transistor layouts that define multiple unit cells in series for each gate finger. Individually, each of the unit cells has a shorter effective gate width. However, when connected in series, the unit cells can increase the effective length of a single gate finger. The gate fingers of the series-connected unit cells are connected to a gate bus by means of a second metal bridge that runs over the source contacts of the unit cells. The metal bridge is connected between the source contacts to connecting bars that run along the surface of the substrate between the source contacts and connect to the gate finger.

A transistor having a layout as described herein may have higher frequency performance and higher output power while at the same time having a reduced current density, which can improve device reliability.

Pursuant to further embodiments of the present invention, multi-cell transistors with large effective gate widths are provided in which a plurality of series gate resistors (which are also referred to as "gate resistors" herein) are distributed throughout the device. For example, the transistors may have segmented gate fingers, and a series gate resistor may be provided for each gate finger segment or for pairs of gate finger segments. This approach breaks up long feedback loops within the gate fingers and drains of the transistor structure by making the feedback loops lossy enough to avoid high levels of instability. The distributed series gate resistors may be positioned, for example, in the gap regions that are provided between the gate finger segments of the gate fingers.

Thus, in some embodiments, transistors are provided that include a drain contact extending along a first axis, a source contact extending along a second axis that is parallel to the first axis, and a gate finger extending between the source contact and the drain contact. The gate finger may comprise a plurality of physically discontinuous, collinear gate finger segments that are electrically connected to each other by one or more other structures (e.g., a gate jumper). The transistor further includes a plurality of spaced-apart gate resistors that are electrically connected to the gate finger. At least one of the gate resistors is disposed in a portion of the region between the first axis and the second axis that is between a first end and a second end of the gate finger when the transistor is viewed from above. In some embodiments, a gate jumper may be electrically connected to the gate finger, and the gate jumper may be electrically connected to a gate bus. The gate jumper may be interposed along an electrical path between a first of the gate finger segments and the gate bus, and a first of the gate resistors may be interposed along an electrical path between the gate jumper and the first of the gate finger segments.

In other embodiments, transistors are provided that include a source contact extending in a first direction, a gate jumper extending in the first direction, and a gate finger that comprises a plurality of discontinuous gate finger segments that extend in the first direction. The transistor further includes a plurality of spaced-apart gate resistors, each of which is electrically connected to the gate jumper. A first of the gate finger segments is connected to the gate jumper through a first of the gate resistors.

Pursuant to still further embodiments of the present invention, multi-cell transistors with large effective gate widths are provided in which a plurality of odd mode resistors are distributed throughout the device. In an example embodiment, odd mode resistors may be provided in the gap regions that are formed between the "gate splits," where a gate split refers to the regions where a plurality of gate finger segments extend in parallel to each other. The odd mode resistors may be distributed throughout these gap regions to further improve the stability of the transistor. The above described gate resistors may also be located in these gap regions.

Thus, in additional embodiments, transistors are provided that include a plurality of gate fingers that extend in a first direction and that are spaced apart from each other in a second direction that is perpendicular to the first direction, each of the gate fingers comprising at least spaced-apart and generally collinear first and second gate finger segments that are electrically connected to each other, where the first gate finger segments are separated from the second gate finger segments in the first direction by a gap region that extends in the second direction. At least one resistor is disposed in the gap region. The at least one resistor may be an odd mode resistor and/or a series gate resistor.

The transistors according to embodiments of the inventive concepts may have large effective gate widths, support increased power density levels and exhibit improved frequency response as compared to conventional transistors. Additionally, the gate series resistors and odd mode resistors, if provided, may help prevent feedback loops that may generate unwanted signals at frequencies that are low enough to be close to or within the operating frequency range of the transistor. Accordingly, the transistors may also exhibit increased stability and hence may have improved production yields and/or better reliability.

It will be appreciated that the above-described embodiments may be combined in any fashion. For example, transistors may be provided that include both distributed gate resistors and distributed odd mode resistors. Likewise, transistors having non-segmented gate fingers may include either or both distributed gate resistors and distributed odd mode resistors.

Embodiments of the present invention will now be described in greater detail with reference to FIGS. 2-15.

Figure 2:
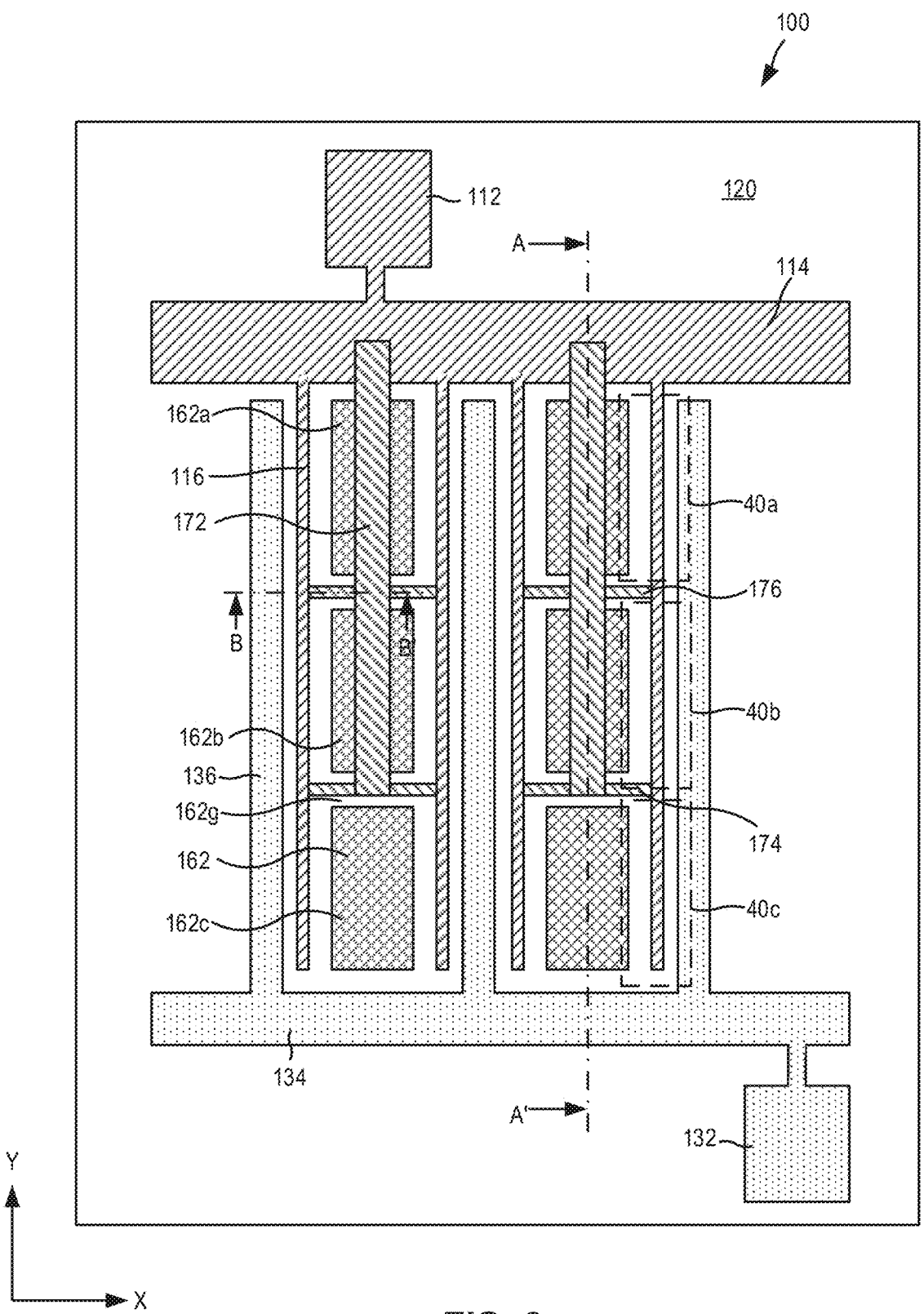
FIG. 2 is a plan view of a metal layout of a transistor in accordance with some embodiments.
Figure 5:
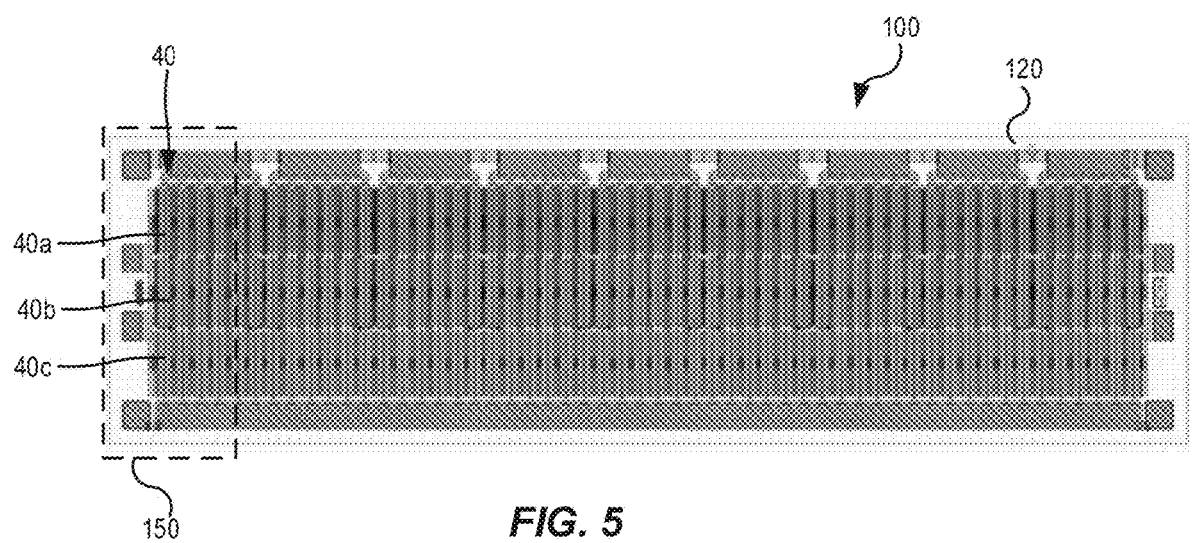
FIG. 5 is a plan view of a larger version of the transistor of FIG. 2.
Figure 6:
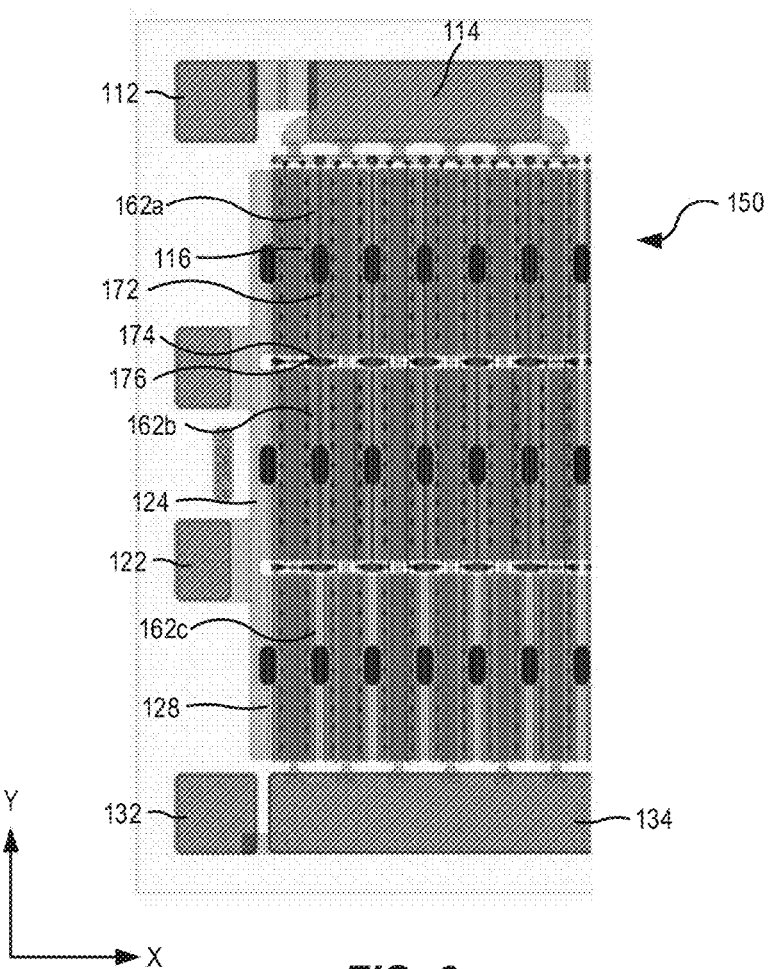
FIG. 6 is a detail plan view of a small portion of the transistor of FIG. 5.

FIG. 2 is a plan view of a metal layout of a transistor 100 in accordance with some embodiments. The transistor is formed on a semiconductor structure 120 that includes one or more device epitaxial layers which are described in greater detail below. The layout of FIG. 2 is simplified for ease of understanding and includes a gate pad 112 that is connected to a gate bus 114 and a drain pad 132 that is connected to a drain bus 134. The source pad and source bus are omitted from FIG. 2 for clarity of illustration, but are illustrated in FIGS. 5 and 6.

A plurality of gate fingers 116 are connected to the gate bus 114 and extend in the y-direction. Likewise, a plurality of drain contacts 136 are connected to the drain bus 134 and extend in parallel with and adjacent to respective ones of the gate fingers 116. Although only four gate fingers 116 and three drain contacts 136 are illustrated in FIG. 2, it will be appreciated that the transistor 100 may have many more gate fingers 116 and drain contacts 136 so that the transistor has a large number of unit cells.

Source contacts 162 are also provided and extend in the y-direction in parallel with adjacent ones of the gate fingers 116. The source contacts 162 are divided in the y-direction into respective source contact segments 162a, 162b and 162c. The source contact segments may be connected by means of source contact bars 128 (FIG. 6) that extend laterally across the device structure (in the x-direction). The source contact segments 162a, 162b, 162c may be connected by other means. For example source contact plugs may be provided that electrically connect each source contact segment 162a, 162b, 162c to a common conductive layer located, for example, in a lower level of the device.

Adjacent ones of the source contact segments 162a-162c are separated by gaps 162g. Although FIG. 2 illustrates three source contact segments 162a-162c for each source contact 162, the inventive concepts are not limited to such a configuration, and it will be appreciated that the source contact 162 may include two or more source contact segments 162a-162c.

The gate fingers 116 may extend in parallel with the source contacts 162 for the entire length of the source contacts 162. However, because the source contacts 162 are divided into source contact segments 162a-162c, the source contact segments 162a, 162b and 162c define a plurality of series unit cells 40a, 40b, 40c for each of the gate fingers 116. That is, each gate finger 116 acts as a gate contact for a plurality of unit cells 40a, 40b, 40c that are laid out in the direction (y-direction) along which the gate fingers 116 extend and that defines the width of the gate fingers 116. Thus, the total width contributed to the gate periphery of the overall device by each gate finger 116 is equal to the distance by which the gate finger 116 overlaps the adjacent source contact segments 162a, 162b and 162c in the y-direction.

The transistor 100 further includes a plurality of gate jumpers 172 that extend along the y-direction in parallel with the gate fingers 116. The gate jumpers 172 may be formed over the source contacts 162, and may be insulated from the source contacts 162 by, for example, a dielectric layer and/or an air gap. The gate jumpers 172 are electrically connected to the gate bus 114, and connect each gate finger 116 to the gate bus 114 at multiple locations along the gate finger 116.

In particular, the gate jumpers 172 connect to the gate fingers 116 through gate signal distribution bars 174 that are provided at multiple locations along the width of the device and that extend laterally (in the x-direction) within the gaps 162g between adjacent ones of the source contact segments 162a, 162b and 162c. The gate signal distribution bars 174 contact the gate fingers 116 at respective gate signal distribution points 176. Thus, an electrical signal applied to the gate pad 112 (a "gate signal") is carried to the gate bus 114, and then to the gate jumpers 172, which distribute the gate signal to the gate fingers 116 at multiple locations (the gate signal distribution points 176) along the width of the gate fingers 116. Thus, in the embodiment of FIG. 2, rather than having the gate fingers 116 carry the gate signal for the entire width of the device, the gate signal is carried by the gate jumpers 172 over a large part of the width of the device and then distributed to the gate fingers 116 at various locations along the width of the device.

The gate jumpers 172 may have larger cross sectional areas than the gate fingers 116, and thus may be better able to handle higher current densities than the gate fingers 116 without the problems normally associated with increased gate widths, such as electromigration and reduction of high frequency gain performance.

Figure 3:
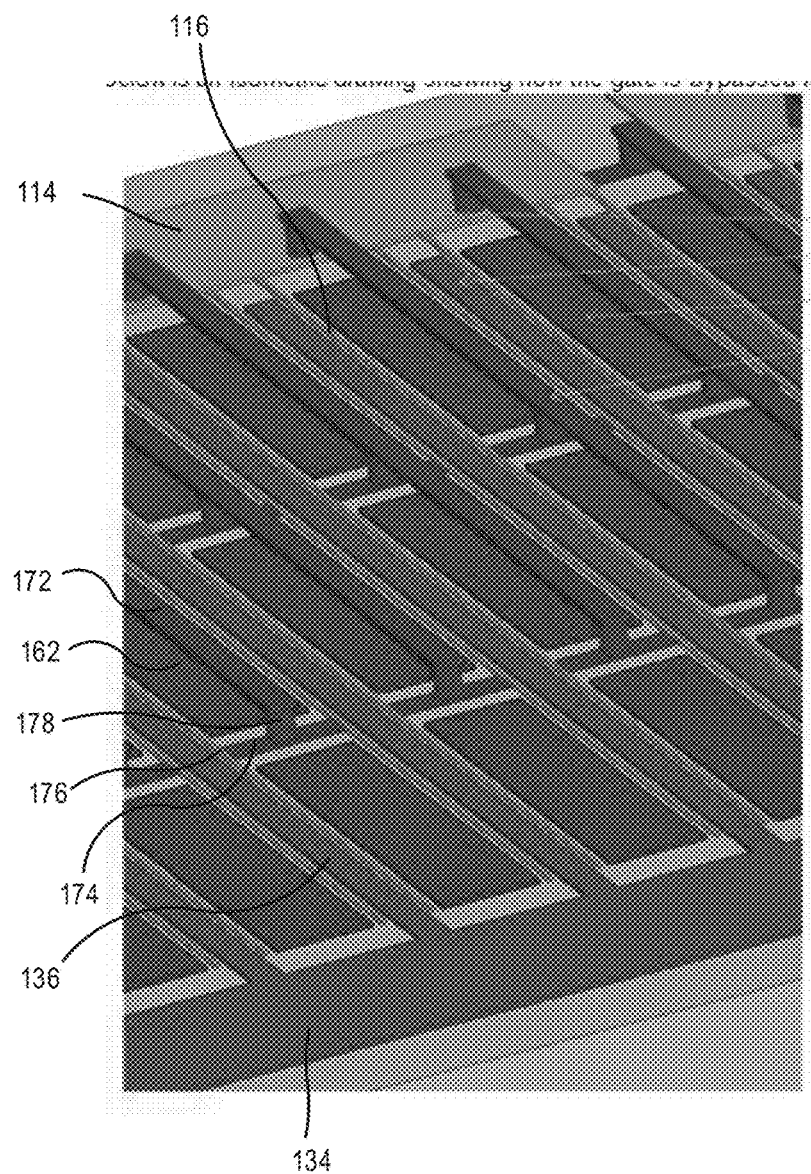
FIG. 3 is a partial isometric view of the transistor of FIG. 2.
Figure 4:
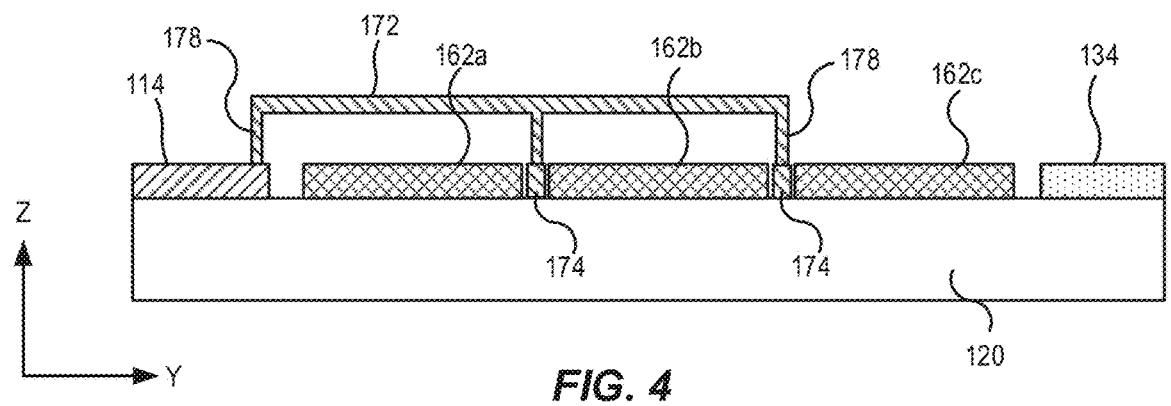
FIG. 4 is a partial cross section of the transistor of FIG. 2 taken along line A-A' of FIG. 2.

FIG. 3 is a partial isometric view of the metal layout of transistor 100, and FIG. 4 is a partial cross section taken along line A-A' of FIG. 2. As can be seen in FIGS. 3 and 4, the gate jumpers 172 are formed at a metal level higher than the metal level of the source contact segments 162a, 162b, 162c, the gate fingers 116, the gate bus 114 and the gate signal distribution bars 174. The gate jumpers 172 are connected to the gate bus 114 and the gate signal distribution bars 174 by vertical contact plugs 178.

The gate jumpers 172, gate bus 114, vertical contact plugs 178 and gate signal distribution bars 174 may be formed of a conductive material, such as copper or aluminum, having a very low resistance.

FIG. 5 is a plan view of a larger version of transistor 100, and FIG. 6 is a detail plan view of a small portion 150 of the metal layout of FIG. 5 (namely the portion within the dotted box in FIG. 5). The transistor 100 includes a plurality of unit cells 40 that extend vertically (in the y-direction). Each of the unit cells 40 includes one gate finger 116 that extends over the entire width of the device, and is subdivided into series unit cells 40a, 40b, 40c that are arranged in the vertical direction (y-direction) as described above. In the embodiment illustrated in FIGS. 5 and 6, each of the unit cells 40 has an overall width of 1120 microns, with the series unit cells 40a, 40b, and 40c having widths of 370 microns, 380 microns and 370 microns, respectively, although the inventive concepts are not limited to these particular dimensions. In this manner, the effective gate width of the device may be increased.

Referring to FIG. 6, a gate pad 112 and gate bus 114 are provided at the one end of the structure, while a drain pad 132 and drain bus 134 are provided at the other end of the structure. Source pads 122 are provided on the side of the structure and are connected to a source bus 124. The source bus 124 is connected to a plurality of source contact bars 128 that extend in the lateral direction (x-direction) to contact the source contact segments 162a, 162b, 162c. As noted above, the source contact segments 162a, 162b, 162c may be electrically connected in other ways such as through the use of source contact plugs that electrically connect each source contact segment 162a, 162b, 162c to a common conductive layer.

The detail view of the portion 150 of the device layout of the transistor 100 in FIG. 6 also illustrates the gate fingers 116, the gate jumpers 172, gate signal distribution bars 174 and the gate signal distribution points 176 where the gate signal distribution bars 174 contact the gate fingers 116.

Figure 7:
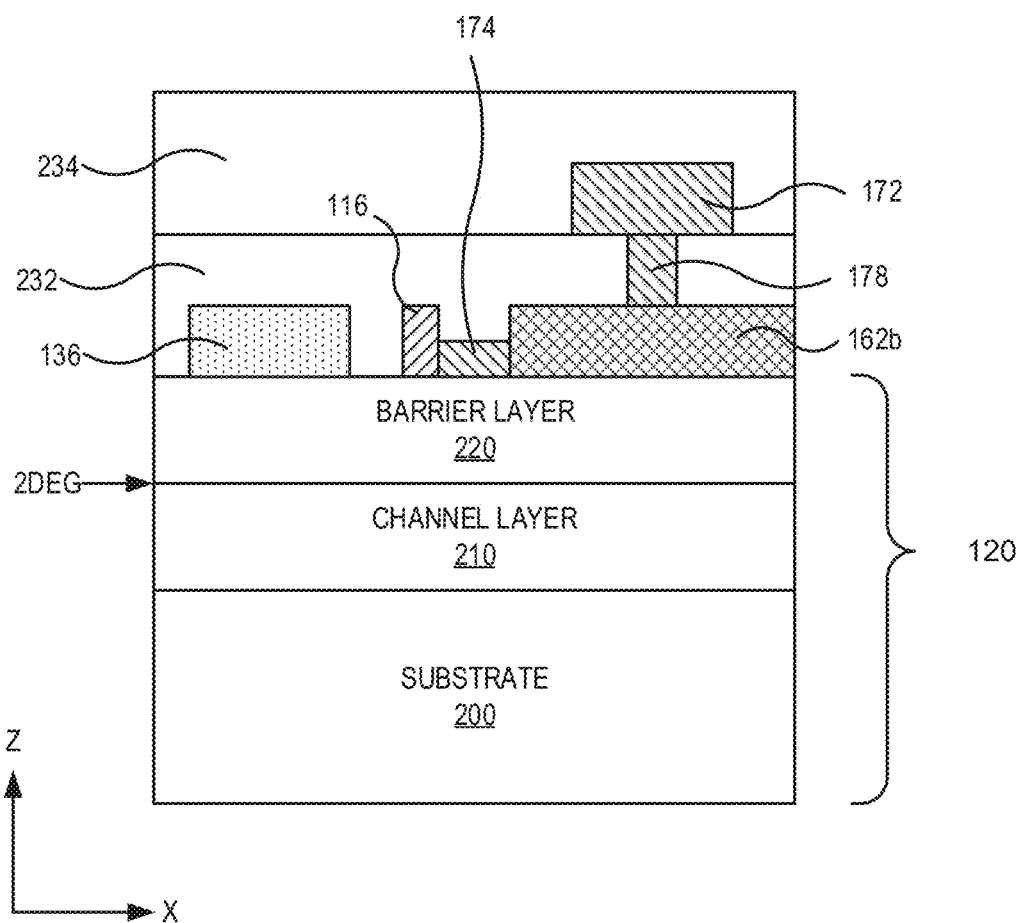
FIG. 7 is a cross-section of a unit cell of a transistor device taken along line B-B' of FIG. 2.

FIG. 7 is a cross-section of a unit cell 40 of a transistor device 100 taken along line B-B' of FIG. 2. The transistor structure 100 includes a semiconductor structure 120 including a substrate 200, which may, for example, include 4H—SiC or 6H—SiC. A channel layer 210 is formed on the substrate 200, and a barrier layer 220 is formed on the channel layer 210. The channel layer 210 and the barrier layer 220 may include Group III-nitride based materials, with the material of the barrier layer 220 having a higher bandgap than the material of the channel layer 210. For example, the channel layer 210 may comprise GaN, while the barrier layer 220 may comprise AlGaN.

Due to the difference in bandgap between the barrier layer 220 and the channel layer 210 and piezoelectric effects at the interface between the barrier layer 220 and the channel layer 210, a two dimensional electron gas (2DEG) is induced in the channel layer 210 at a junction between the channel layer 210 and the barrier layer 220. The 2 DEG acts as a highly conductive layer that allows conduction between the source and drain regions of the device that are beneath a source contact segment 162b and a drain contact 136, respectively. The source contact segment 162b and the drain contact 136 are formed on the barrier layer 220. A gate finger 116 is formed on the barrier layer 220 between the drain contact 136 and the source contact segment 162b. A gate jumper 172 is provided over the source contact segment 162b, and is connected to the gate finger 116 through a vertical contact plug 178 and a gate signal distribution bar 174. The vertical contact plug 178 and the gate signal distribution bar 174 are provided in gaps 162g between adjacent ones of the source contact segments 162a-162c and do not physically contact the source contact segments 162a-162c. Note that the source contact segment 162b is not actually in the cross-section of FIG. 7 as it is offset in the y-direction from the cut along line B—B' (see FIG. 2), but is illustrated in FIG. 7 to facilitate the above explanation.

A first interlayer insulating layer 232 is formed over the drain contact 136, the gate finger 116, the source contact segment 162b and the gate signal distribution bar 174. The interlayer insulating layer 232 may include a dielectric material, such as SiN, SiO$_2$, etc. The vertical contact plug 178 penetrates the first interlayer insulating layer 232. The gate jumper 172 is formed on the first interlayer insulating layer 232, which insulates the gate jumper 172 from the source contact segment 162b. A second interlayer insulating layer 234 may be formed on the first interlayer insulating layer 232 and the gate jumper 172. The second interlayer insulating layer 234 may include a dielectric material, such as SiN, SiO$_2$, etc.

The material of the gate finger 116 may be chosen based on the composition of the barrier layer 220. However, in certain embodiments, conventional materials capable of making a Schottky contact to a nitride based semiconductor material may be used, such as Ni, Pt, NiSi$_x$, Cu, Pd, Cr, W and/or WSiN. The drain contacts 136 and source contact segments 162 may include a metal, such as TiAlN, that can form an ohmic contact to GaN.

Series gate resistors and odd mode resistors may be included in the high power transistors according to embodiments of the present invention in order to stabilize the feedback loops within the gate fingers and drains of the device. In high power devices, the gates may have long gate widths in order to increase the gate periphery of the device, which results in long feedback loops. Because these high power transistors have large transconductance values, the feedback loops may be prone to instability. In particular, the feedback loops may generate an unwanted signal which may be in or out of the frequency band of operation of the transistor. In either case, the generation of such a signal may be problematic, and may render the transistor unusable. The instability of the feedback loops tends to increase with the length of the feedback loop.

Pursuant to further embodiments of the present invention, high power transistors are provided that include multiple series gate resistors and/or odd mode resistors that are distributed throughout the device and, in particular, along the long gate fingers. The distributed series gate resistors and/or odd mode resistors may be particularly advantageous in transistors that have segmented gate fingers as such devices may include gap regions between the "gate splits" that are natural locations for locating the series gate resistors and/or odd mode resistors along the width of the gate fingers. Herein, the term "gate splits" refers to the shorter arrays of gate finger segments that are produced when long gate fingers are segmented into multiple gate finger segments as discussed above with reference to FIGS. 2-7. The gap regions that are present between adjacent gate splits may be a convenient location for implementing the distributed series gate resistors and odd mode resistors, as will be discussed in greater detail below.

It has been found that by distributing the series gate resistors and/or odd mode resistors along the extended width of the gate fingers, the feedback loops may become sufficiently lossy such that the potential instability is overcome. Accordingly, by distributing the series gate resistors and/or odd mode resistors along the extended width of the gate fingers it may be possible to increase device yield and/or reduce the failure rate of devices in the field. Moreover, when the series gate resistors and/or odd mode resistors are distributed along and between gate finger segments of a segmented gate fingers, relatively small resistance levels may be used. For example, if a transistor has three gate splits, the resistance levels may be about one third the size of the resistance levels that would be used if the gate fingers were not segmented. Moreover, in practice it has been found that the reduction in the resistance values is even greater. For example, when three gate splits are used, the series resistors included along each gate segment may have resistance values that are one fourth to one fifth of the resistance value of a series gate resistor that is implemented at the gate pad. The use of resistors having lower resistance values reduces losses and therefore results in a transistor having a higher gain, while also exhibiting increased stability.

Figure 8:
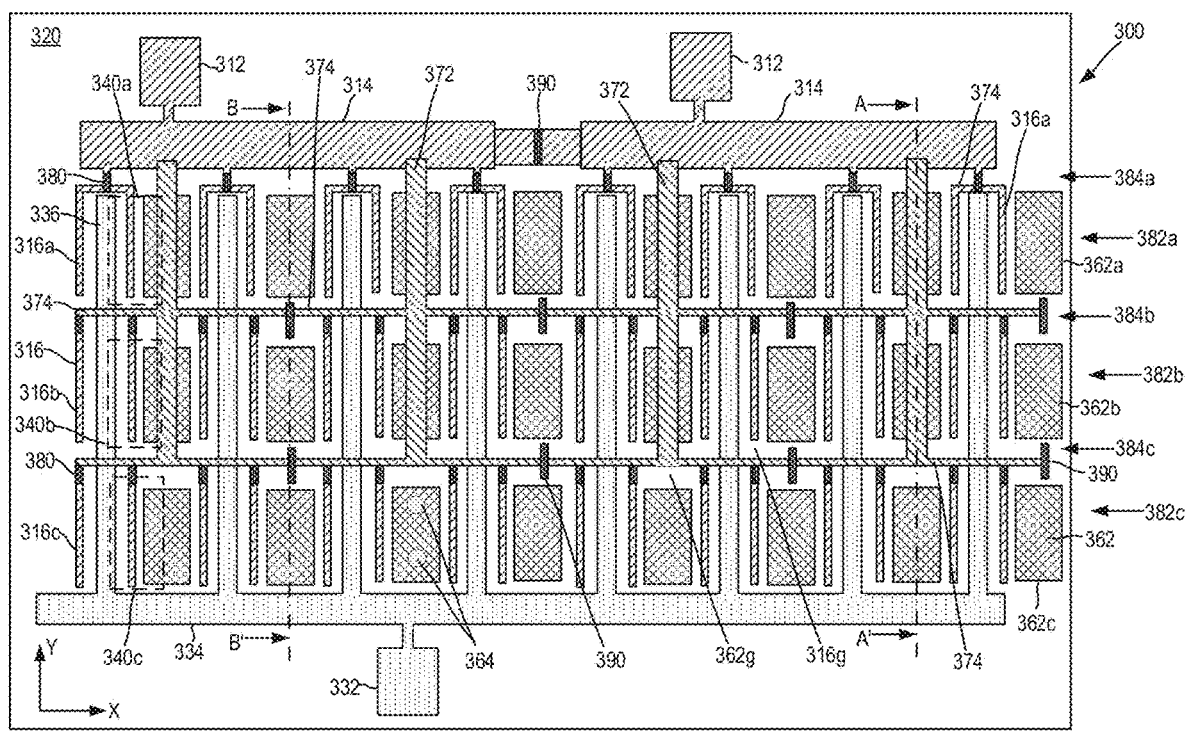
FIG. 8 is a plan view of a metal layout of a transistor in accordance with further embodiments.
Figure 10:
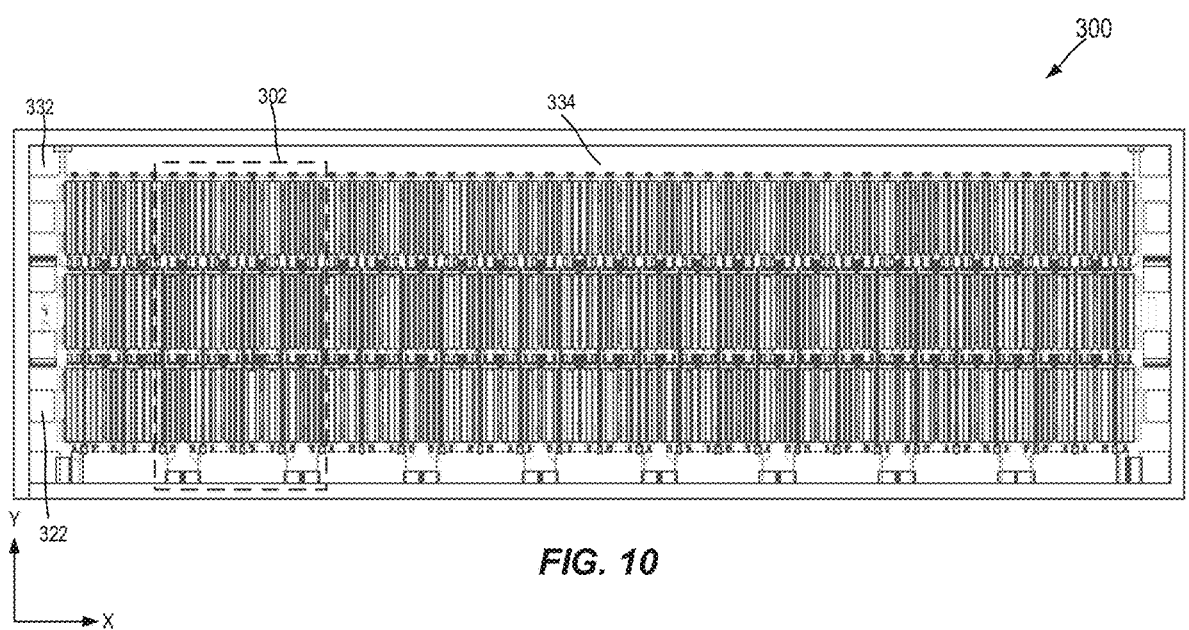
FIG. 10 is a plan view of a larger version of the transistor of FIG. 8.

FIG. 8 is a plan (top) view of a metal layout of a transistor 300 in accordance with further embodiments that implements both the series gate resistors and the odd mode resistors in a distributed fashion, as discussed above. The transistor 300 is formed on a semiconductor structure 320 that includes one or more device epitaxial layers. The semiconductor structure 320 may be the same as the semiconductor structure 120 discussed above with reference to FIG. 7. As with the preceding figures, the layout of FIG. 8 is simplified for ease of understanding and includes a pair of gate pads 312 that are connected to a respective pair of gate buses 314, as well as a drain pad 332 that is connected to a drain bus 334. A source pad 322 and source bus are also included in the transistor 300, but are omitted from FIG. 8 for clarity of illustration. The source pad 322 is shown in FIG. 10.

Figure 9A:
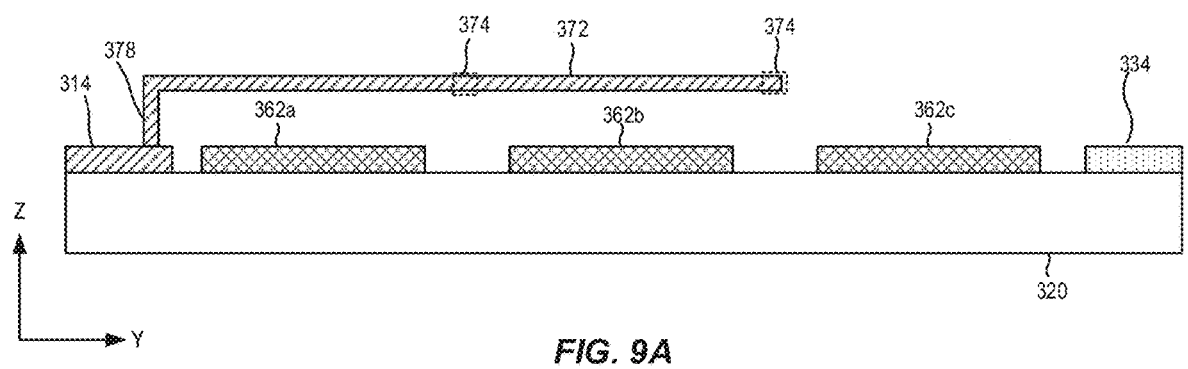
FIG. 9A is a partial cross section taken along line A-A' of FIG. 8.
Figure 11:
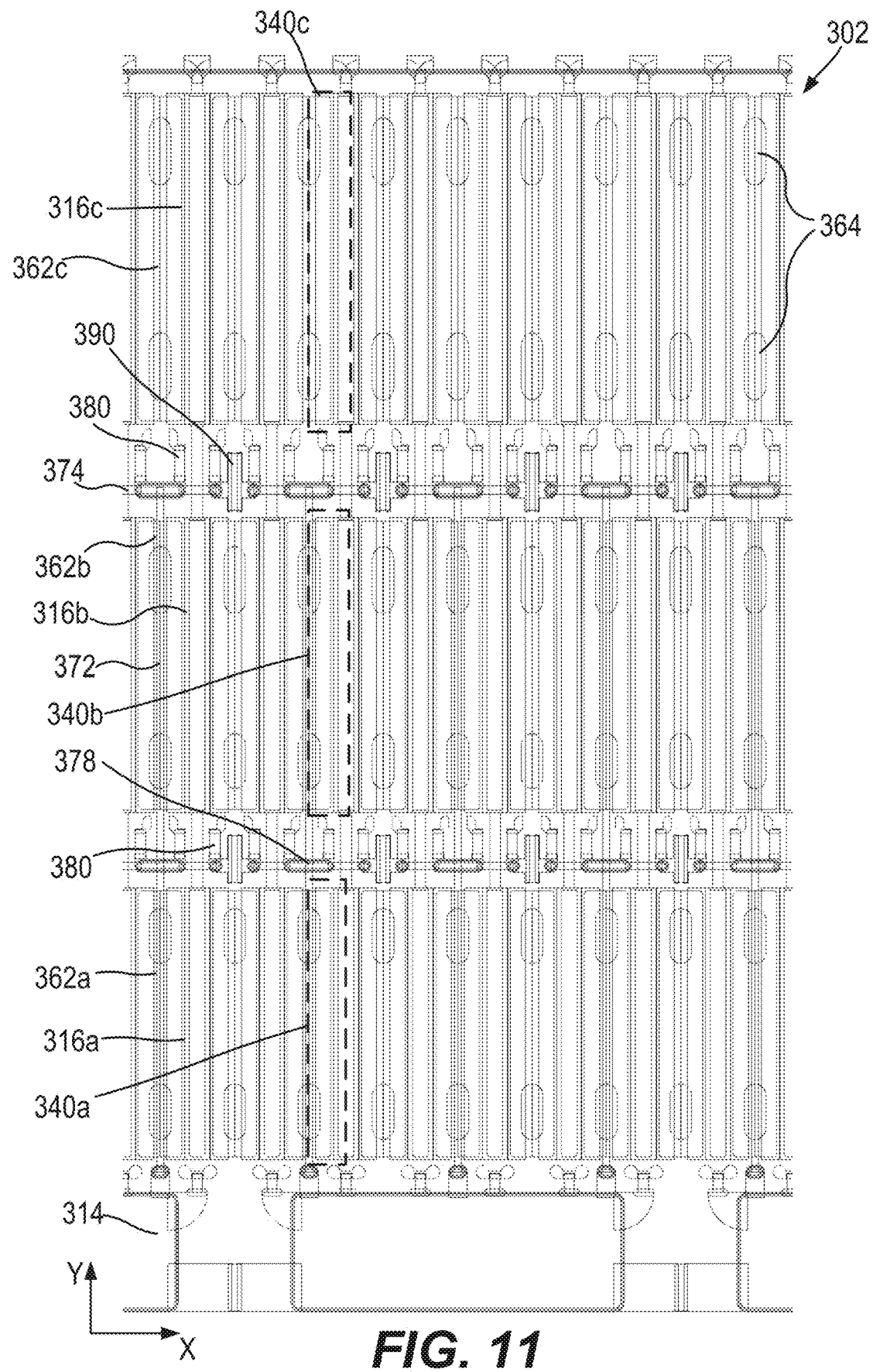
FIG. 11 is a detail plan view of a small portion of the transistor of FIG. 10.

A plurality of gate fingers 316 are connected to each gate bus 314 and extend in the y-direction. Each gate finger 316 is divided in the y-direction into three gate finger segments 316a, 316b and 316c. As described below, the gate finger segments 316a, 316b, 316c of each gate finger 316 may be electrically connected to each other via gate jumpers 372, gate signal distribution bars 374 and vertical contact plugs 378 (FIG. 9A). A plurality of drain contacts 336 are connected to the drain bus 334 and extend in parallel with and adjacent respective ones of the gate fingers 316. The gate signal distribution bars 374 may be formed at a different vertical level in the device than the gate distribution bars 174 of transistor 100 to allow the gate signal distribution bars 374 to pass over the drain contacts 336, as will be described below. Source contacts 362 are also provided and extend in the y-direction in parallel with adjacent ones of the gate fingers 316. The source contacts 362 are also divided in the y-direction into respective source contact segments 362a, 362b and 362c. The source contact segments 362a, 362b, 362c may be electrically connected to each other via source contact plugs 364. Each source contact plug 364 may electrically connect a respective source contact segment 362a, 362b, 362c to a common conductive layer that acts as a source bus. This source bus may be located, for example, in a lower level of the device. More than one source contact plug 364 may be provided per source contact segment 362a, 362b, 362c in some embodiments. Two representative source contact plugs 364 are illustrated on one source contact segment 362c in FIG. 8. The source contact plugs 364 for the other source contact segments 362a, 362b, 362c have been omitted from FIG. 8 (as well as from FIGS. 9A-9B and 12-13) to simplify the drawings. FIGS. 10 and 11 illustrate how, for example, a pair of source contact plugs 364 may be provided for each source contact segment 362a, 362b, 362c. The source contact segments 362a, 362b, 362c may also be electrically connected by other means such as, for example, source contact bars. In FIG. 8, a total of sixteen segmented gate fingers 316, eight segmented source contacts 362 and eight drain contacts 336 are shown. It will be appreciated, however, that the transistor 300 may have many more gate fingers 316, source contacts 362 and drain contacts 336 so that the transistor 300 has a large number of unit cells. Fewer gate fingers 316, source contacts 362 and drain contacts 336 may be provided in other embodiments.

Adjacent ones of the gate finger segments 316a-316c are separated by gaps 316g, and adjacent ones of the source contact segments 362a-362c are separated by gaps 362g. Although FIG. 8 illustrates three gate finger segments 316a-316c and three source contact segments 362a-362c for each respective gate finger 316 and source contact 362, the inventive concepts are not limited to such a configuration. Thus, it will be appreciated that a gate finger 316 may include two or more gate finger segments and that a source contact 362 may include two or more source contact segments.

The gate fingers 316 may extend in parallel with the source contacts 362 for the entire length of the source contacts 362. Because the gate fingers 316 and source contacts 362 are segmented, a plurality of unit cells 340a, 340b, 340c are defined along each gate finger 316. That is, each gate finger segment 316a-316c acts as a gate contact for a respective unit cell 340a, 340b, 340c that are laid out in the direction (y-direction) along which the gate fingers 316 extend. The sum of the width of the gate finger segments 316a-316c defines the total width of each gate finger 316. Thus, the total width contributed to the gate periphery of the overall device by each gate finger 316 is equal to the sum of the widths of the gate finger segments 316a-316c in the y-direction.

The transistor 300 further includes a plurality of gate jumpers 372 that extend along the y-direction in parallel with the gate fingers 316. The gate jumpers 372 may be formed at a metal level higher than the metal level of the source contact segments 362, the gate fingers 316 and the gate buses 314. The gate jumpers 372 may be formed over the source contacts 362, and may be insulated from the source contacts 362 by, for example, a dielectric layer and/or an air gap. The gate jumpers 372 need not extend over the source contact segments 362c that are farthest from the gate buses 314. The gate jumpers 372 are electrically connected to the gate buses 314. The gate jumpers 372 may electrically connect some or all of the gate finger segments 316a-316c of each gate finger 316 to one of the gate buses 314. In the embodiment depicted in FIG. 8, each gate jumper 372 electrically connects gate finger segments 316b and 316c to a gate bus 314, while gate finger segments 316a are connected to the gate buses 314 via more direct connections. Gate finger segments 316a may be connected to the gate buses 314 through the gate jumper 372 in other embodiments. In some embodiments, the gate jumpers 372 may be positioned over the drain contacts 336 or the gate fingers 316 instead of over the source contacts 362.

Figure 9B:
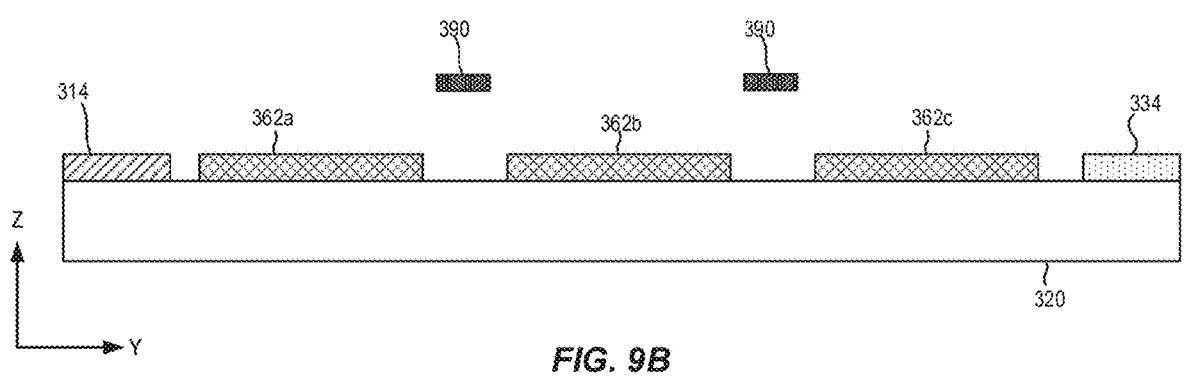
FIG. 9B is a partial cross section taken along line B-B' of FIG. 8.

FIG. 9A is a partial cross section taken along line A-A' of FIG. 8. FIG. 9B is a partial cross section taken along line B-B' of FIG. 8. As can be seen in FIGS. 8 and 9A, a plurality of gate jumpers 372, gate signal distribution bars 374 and vertical contact plugs 378 are provided. The gate jumpers 372 are connected to a gate bus 314 and the gate signal distribution bars 374 by the vertical contact plugs 378. The gate jumpers 372, gate signal distribution bars 374 and vertical contact plugs 378 are used to connect each gate finger segment 316b-316c to one of the gate buses 314. The gate signal distribution bars 374 may be formed at a higher metal layer in the device than the gate fingers 316. For example, the gate signal distribution bars 374 may be formed in the same metal layer of the device as the gate jumpers 372, as shown in FIG. 9A. Vertical contact plugs 378 may connect the gate jumpers 372 to the gate buses 314. Additional vertical contact plugs 378 (not visible in the cross-section of FIG. 9A, but located at the points where each gate signal distribution bar passes over a gate resistor 380 in the plan view of FIG. 8) may physically and electrically connect the gate signal distribution bars 374 to the gate resistors and the gate finger segments 316a-316c connected thereto. As noted above, the gate jumpers 372 may extend over and above the source contacts 362. As can be seen in FIG. 8, a gate jumper 372 is provided over every other source contact 362, in contrast to the transistor 100 of FIGS. 2-7 which included a gate jumper 172 extending over every source contact 162. Each gate jumper 372 in the transistor 300 of FIGS. 8-9B thus feeds four gate fingers 316 instead of two gate fingers 116 as in the case of transistor 100. The gate signal distribution bars 374 are formed at a higher metal layer in the device than the gate distribution bars 174 of transistor 100 to allow each gate signal distribution bar 374 to pass over two drain contacts 336 to connect to the outer ones of the four gate finger segments 316a-316c.

The gate jumpers 372, gate buses 314, vertical contact plugs 378 and gate signal distribution bars 374 may be formed of a conductive material, such as copper or aluminum, having a very low resistance.

Still referring to FIGS. 8 and 9A, the gate signal distribution bars 374 extend laterally (in the x-direction) in the gaps 362g between adjacent ones of the source contact segments 362a, 362b and 362c. The gate signal distribution bars 374 that are coupled to the first gate finger segments 316a may be coupled to two of the gate finger segments 316a. Each of the gate signal distribution bars 374 that are coupled to the second or third gate finger segments 316b, 316c may be coupled to four of the gate finger segments 316b or 316c. As can be seen in FIG. 8, each gate signal distribution bar 374 that is coupled to the first gate finger segments 316a may connect to one of the gate buses 314 through a gate resistor 380. The gate signal distribution bars 374 that connect to the gate finger segments 316a may be part of the same metal layer as the gate fingers 316 or part of the same metal layer as the gate jumpers 372, since these gate signal distribution bars 374 need not cross the drain contacts 336. Each gate signal distribution bar 374 that is coupled to either second gate finger segments 316b or third gate finger segments 316c may connect to one of the gate buses 314 through one of the gate jumpers 372, and may connect to the gate finger segments 316b, 316c through respective vertical contact plugs 378, as can be seen in FIGS. 8 and 9A. A series gate resistor 380 is provided on the electrical path between each gate finger segment 316b, 316c and its associated gate signal distribution bar 374.

Referring still to FIGS. 8 and 9A, the distribution of an electrical signal that is applied to the gate pad 312 on the left-hand side of FIG. 8 to the leftmost gate finger segments 316a, 316b, 316c in FIG. 8 will now be discussed. When the gate signal is applied to the gate pad 312, it is carried to the left gate bus 314. The gate signal travels from the left gate bus 314 through a first gate signal distribution bar 374 and a first series gate resistor 380 to the first gate finger segment 316a. The gate signal also travels from the left gate bus 314 through a first vertical contact plug 378 that connects the gate bus 314 to a gate jumper 372, through the gate jumper 372 to a second gate signal distribution bar 374, and through the second gate signal distribution bar 374 to a second vertical contact plug 378 that connects to the leftmost second gate finger segment 316b through a second series gate resistor 380. Similarly, the gate signal travels from the left gate bus 314 through the first vertical contact plug 378 to the gate jumper 372, through the gate jumper 372 to a third gate signal distribution bar 374, and through the third gate signal distribution bar 374 to a third vertical contact plug 378 that connects to the leftmost third gate finger segment 316c through a third series gate resistor 380.

Thus, as shown in FIGS. 8 and 9A, the gate signal does not travel the full length of any gate finger 316, but instead travels only along the length of a gate finger segment (for example, gate finger segments 316a) or along the length of a gate finger segment and part of the gate jumper 372 (for example, gate finger segments 316b) or along the length of a gate finger segment and the full length of the gate jumper 372 (for example, gate finger segments 316c). The gate jumpers 372 may have larger cross sectional areas than the gate fingers 316, and thus may be better able to handle higher current densities than the gate fingers 316 without the problems normally associated with increased gate widths, such as electromigration and reduction of high frequency gain performance. The gate signals also travel along a portion of a gate signal distribution bar 374 and vertical contact plugs 378. However, it should be noted that FIG. 8 is not drawn to scale and that the distance that a gate signal travels along any gate signal distribution bar 374 may be very small compared to the length of a gate finger segment in the y-direction (e.g., less than 5%), as can be seen in FIGS. 10-11. The distances travelled along the vertical contact plugs 378 are also very small. Accordingly, the distance that the gate signals travel along narrow conductive traces may be reduced.

As discussed above, the transistor 300 includes a plurality of series gate resistors 380 that are distributed throughout the device. In particular, a series gate resistor 380 is provided at or near one end of each gate finger segment 316a, 316b, 316c. As shown in FIG. 8, the gate fingers 316 are divided into three "gate splits," namely a first gate split 382a that includes the gate finger segments 316a, a second gate split 382b that includes the gate finger segments 316b, and a third gate split 382c that includes the gate finger segments 316c. A first gap region 384a is provided between the gate buses 314 and the first gate split 382a, a second gap region 384b is provided between gate splits 382a and 382b, and a third gap region 384c is provided between gate splits 382b and 382c.

As shown in FIG. 8, the series gate resistors 380 may be formed in the above-described gap regions 384a-384c. The series gate resistors 380 may be formed, for example, by depositing a higher resistivity conductive material, as compared to the conductive material used to form the gate fingers 316, drain contacts 336, source contacts 362, etc. The series gate resistors 380 may be provided in any appropriate vertical level of the transistor 300. In an example embodiment, the series gate resistors 380 may be formed at the same metallization level as the source contacts 362, the drain contacts 336 and the gate fingers 316, as can be seen or inferred from FIGS. 8 and 9A. It will also be appreciated that the gate resistors 380 (or the odd mode resistors 390 discussed below) may be replaced with other lossy elements that may act as the functional equivalent to a resistor, such as, for example, a series inductor-capacitor circuit.

As will be discussed below with reference to FIG. 12, a single series gate resistor 80 may provided between each gate pad 312 and its associated gate bus 314 instead of the distributed series gate resistors 380 included in transistors according to certain embodiments of the present invention. When the series gate resistors are implemented as a single series gate resistor 80 between each gate pad 312 and its corresponding gate bus 314, each series gate resistor 80 may need to have a relatively high resistance value in order to reduce or prevent instabilities in the device. In the transistor 300, a plurality of series gate resistors 380 are positioned between the gate splits 382 of the device. Each of the gate resistors 380 may have a much smaller resistance value as compared to the gate resistors 80 that would be required if gate resistors 80 were only located between the gate pads 312 and the gate buses 314.

A series gate resistor 380 may be provided for each gate finger segment 316*a*, 316*b*, 316*c* in some embodiments, while in other embodiments some gate finger segments may share a series gate resistor 380. In the particular embodiment depicted in FIG. 8, all of the gate finger segments 316*b*, 316*c* have their own associated series gate resistor 380, while pairs of gate finger segments 316*a* share a single series gate resistor 380. It will also be appreciated that in other embodiments, some of the gate finger segments 316*a*-316 may not have an associated gate resistor 380.

By distributing the series gate resistance in two or more locations along the gate fingers 316, the feedback loops within the gate fingers and drains of the transistor may be made sufficiently lossy so that instability may be reduced or eliminated. This may improve device yields and/or reduce the occurrence rate of device failures in the field. Moreover, as described above and as can be seen in FIG. 8, the current path along any particular gate finger segment 316*a*, 316*b*, 316*c* may only traverse a single series gate resistor 380. As the series gate resistors 380 may have relatively small resistance values, power losses are reduced and the transistor 300 may thus support higher gain levels for a given size device.

As can be seen in FIG. 8, the transistor 300 includes a drain contact 336 that extends in the y-direction along a first axis, a source contact 362 that extends in the y-direction along a second axis that is parallel to the first axis, and a gate finger 316 that extends between the source contact 362 and the drain contact 336. The gate finger 316 comprises a plurality of discontinuous and collinear gate finger segments 316*a*, 316*b*, 316*c* that are electrically connected to each other. The transistor 300 further includes a plurality of spaced-apart gate resistors 380 that are electrically connected to the gate finger 316. Each gate resistor 380 may be coupled between a respective one of the gate finger segments 316*a*, 316*b*, 316*c* and a respective one of the gate signal distribution bars 374. At least one of the gate resistors 380 is disposed between the first axis and the second axis. A gate jumper 372 is interposed along an electrical path between a gate bus 314 and the gate finger 316. The gate jumper 372 is interposed along respective electrical paths between gate finger segments 316*b* and 316*c* and the gate bus 314, and respective gate resistors 380 are interposed along respective electrical paths between the gate jumper 372 and the gate finger segments 316*b*, 316*c*.

As can also be seen in FIG. 8, the transistor 300 includes a source contact 362 that extends in the y-direction, a gate jumper 372 that extends in the y-direction, and a gate finger 316 that comprises a plurality of discontinuous and electrically-connected gate finger segments 316*a*, 316*b*, 316*c*. The transistor 300 further includes a plurality of spaced-apart gate resistors 380. Gate finger segments 316*b* and 316*c* are connected to the gate jumper 372 through respective first and second gate resistors 380. Pairs of the gate finger segments 316*a* are connected to the gate buses 314 through respective gate resistors 380.

As is further shown in FIG. 8, odd mode resistors 390 are also included in the transistor 300. The odd mode resistors 390 are provided to break up the long odd mode instability feedback loops in the device. In particular, as the number of gate fingers 316 fed by a gate jumper 372 increases, instabilities may arise. For example, a transistor may be stable when a gate jumper 372 feeds four gate fingers 316, but may start to show instability if the gate jumper 372 is used to feed eight gate fingers 316. When instabilities arise may be a function of the gate finger width and the frequency of operation of the device. The odd mode resistors 390 may be interposed between adjacent gate signal distribution bars 374. When the transistor 300 operates normally, the voltage on each side of each odd mode resistor 390 should be the same, and thus no current should flow between adjacent gate signal distribution bars 374.

Odd mode resistors 390 may be provided in the gap regions 384 that are between adjacent gate splits 382. As shown in FIGS. 8 and 9B, odd mode resistors 390 may be implemented at, for example, the same metallization level as the gate signal distribution bars 374 and source contacts 362, and may be directly connected between two adjacent gate distribution bars 374. Odd mode resistors 390 may also be interposed between adjacent gate buses 314.

Thus, the transistor 300 may include a plurality of gate fingers 316 that extend in the y-direction and that are spaced apart from each other in the x-direction. Each of the gate fingers 316 may include a plurality of spaced-apart and generally collinear gate finger segments 316*a*, 316*b*, 316*c* that are electrically connected to each other, where the gate finger segments 316*a*, 316*b*, 316*c* are arranged in respective gate splits 382*a*, 382*b*, 382*c* that are separated by gap regions 384*b*, 384*c*. Odd mode resistors 390 are disposed in the gap regions 384*b*, 384*c*. In example embodiments, the odd mode resistors 390 may be interposed between adjacent gate signal distribution bars 374.

It will also be appreciated that the source contact 362 need not be segmented in some embodiments. In particular, the gate resistors 380 and the odd mode resistors may both be implemented in the same metal layer as the gate signal distribution bars 374 and the gate jumpers 372. In such an implementation, the source contacts 362 need not be segmented. Thus, it will be appreciated that in other embodiments the resistors 380, 390 may be implemented directly above, or above and to the side of, the source contacts 362 in other embodiments, and that each source contact 362 may be a single, continuous (i.e., non-segmented) source contact 362.

While FIG. 8 depicts a transistor 300 that includes segmented gate fingers 316 and segmented source contacts 362, it will be appreciated that embodiments of the present invention are not limited thereto. For example, in other embodiments, the drain contacts 336 may be segmented in a similar fashion so that each drain contact includes, for example, three separate segments. When the drain contacts 336 are segmented, they may be electrically connected to each other via, for example, drain contact plugs and another metallization layer in the device. In embodiments, where the drain contacts are segmented, the source contacts 362 may or may not be segmented. Additionally, the gate fingers 316 may be segmented as shown in FIG. 8 or may not be segmented as shown in FIG. 2 (as well as in FIGS. 14-15).

Segmenting the drain contacts may provide additional room in the regions between the gate splits for gate resistors 380 and/or odd mode resistors 390. As one simplt example of such an embodiment having segmented drain contacts 336, the transistor 300 of FIG. 8 could be modified so that reference numerals 332, 334 and 336 were a source pad, a source bus and source contacts, respectively, and reference numerals 362 362a/362b/362c and 364 were a drain contact, drain contact segments and drain contact plugs, respectively. In other words, FIG. 8 may also be viewed as an embodiment having segmented gate fingers 316 and segmented drain contacts 362 simply by reversing the source and drain features.

FIG. 10 is a plan view of a larger version of the transistor 300 of FIG. 8. FIG. 11 is a detail plan view of a small portion 302 of the transistor 300 of FIG. 10.

Referring to FIGS. 10 and 11, the transistor 300 includes a plurality of unit cells that extend vertically (in the y-direction). Each of the unit cells includes a gate finger 316 that extends over the entire width of the device, and is subdivided into series unit cells 340a, 340b, 340c that are arranged in the vertical direction (y-direction) as described above. In the embodiment illustrated in FIGS. 10-11, each of the unit cells 340 has an overall width of 1120 microns, with the series unit cells 340a, 340b, and 340c having widths of 370 microns, 380 microns and 370 microns, respectively, although the inventive concepts are not limited to these particular dimensions.

A plurality of gate buses 314 are provided at the one end of the structure, while a drain bus 334 is provided at the other end of the structure. Source pads 322 are provided on the side of the structure and are connected to a source bus that is located, for example, on a lower metallized layer of the device (not shown). The source contact segments 362a, 362b, 362c are connected to the source bus via contact plugs 364.

The detail view of the portion 302 of the device layout of the transistor 300 in FIG. 11 also illustrates the gate fingers 316, the gate jumpers 372, the gate signal distribution bars 374, the series gate resistors 380 and the odd mode resistors 390.

The transistors according to embodiments of the inventive concepts may include a semiconductor structure that is a multiple layer structure. For example, as discussed above with reference to FIG. 7, the semiconductor structure 120 of transistor 100 may include a substrate 200 (e.g., 4H—SiC or 6H—SiC) that has at least a channel layer 210 and a barrier layer 220 formed thereon. The same is true with respect to the other transistors according to embodiments of the inventive concepts that are depicted herein. Thus, while it will be appreciated that the discussion of the semiconductor structure 120 in FIG. 7 applies equally to the semiconductor structures of each of the other embodiments described herein, although the metallization and other aspects of the device will vary based on the differences between the various embodiments depicted in the figures. Thus, for example, it will be appreciated that all of the transistors described herein may include silicon carbide substrates and Group III-nitride based channel and barrier layers, and that the semiconductor structures of these transistors may operate in the manner described with reference to FIG. 7.

Figure 12:
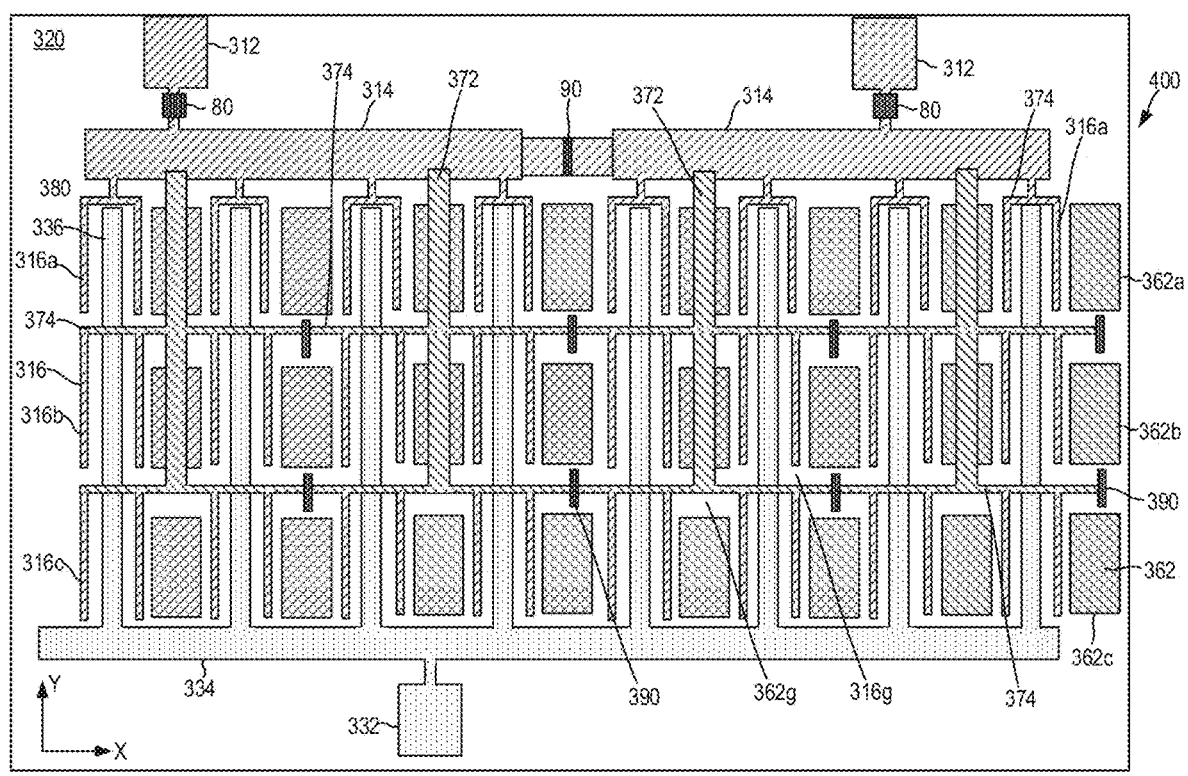
FIG. 12 is a plan view of a metal layout of a transistor in accordance with additional embodiments.

FIG. 12 is a plan view of a metal layout of a transistor 400 in accordance with further embodiments of the inventive concepts. The transistor 400 is similar to the transistor 300 discussed above with reference to FIGS. 8-11, except that the transistor 400 uses a series gate resistors 80 that are connected between each gate pad 312 and a respective gate bus 314 instead of the distributed series gate resistors 380 that are included in the transistor 300. Since aside from this change the two transistors 300, 400 may otherwise be essentially identical, further discussion of the transistor 400 will be omitted.

Figure 13:
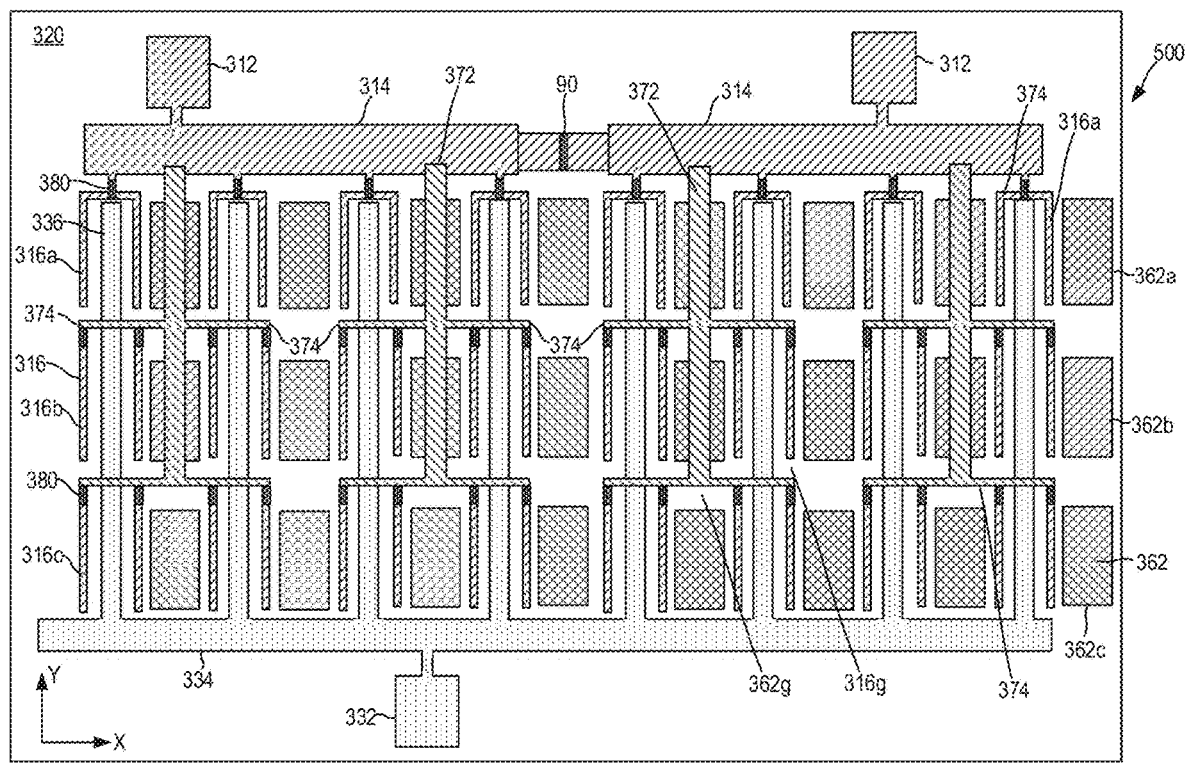
FIG. 13 is a plan view of a metal layout of a transistor in accordance with yet additional embodiments.

FIG. 13 is a plan view of a metal layout of a transistor 500 in accordance with still further embodiments of the inventive concepts. The transistor 500 is also similar to the transistor 300 discussed above with reference to FIGS. 8-11, except that the transistor 500 uses a single odd mode resistor 90 between each pair of adjacent gate buses 314 and does not include the distributed odd mode resistors 390 that are provided in the gap regions 384b, 384c in transistor 300 of FIG. 8. Since aside from this change the two transistors 300, 500 may otherwise be essentially identical, further discussion of the transistor 500 will be omitted.

Figure 14:
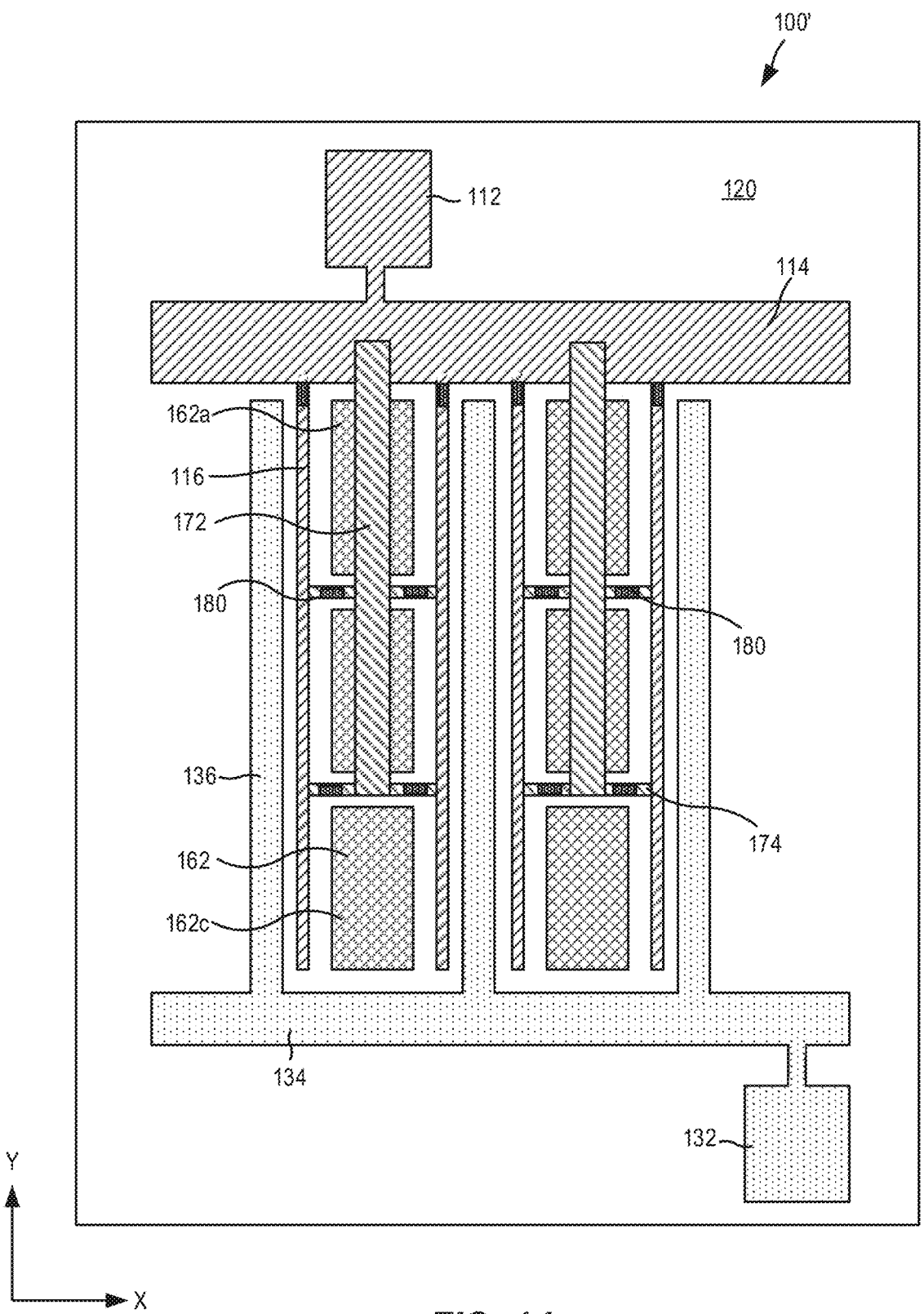
FIG. 14 is a plan view of a metal layout of a transistor in accordance with still further embodiments.
Figure 15:
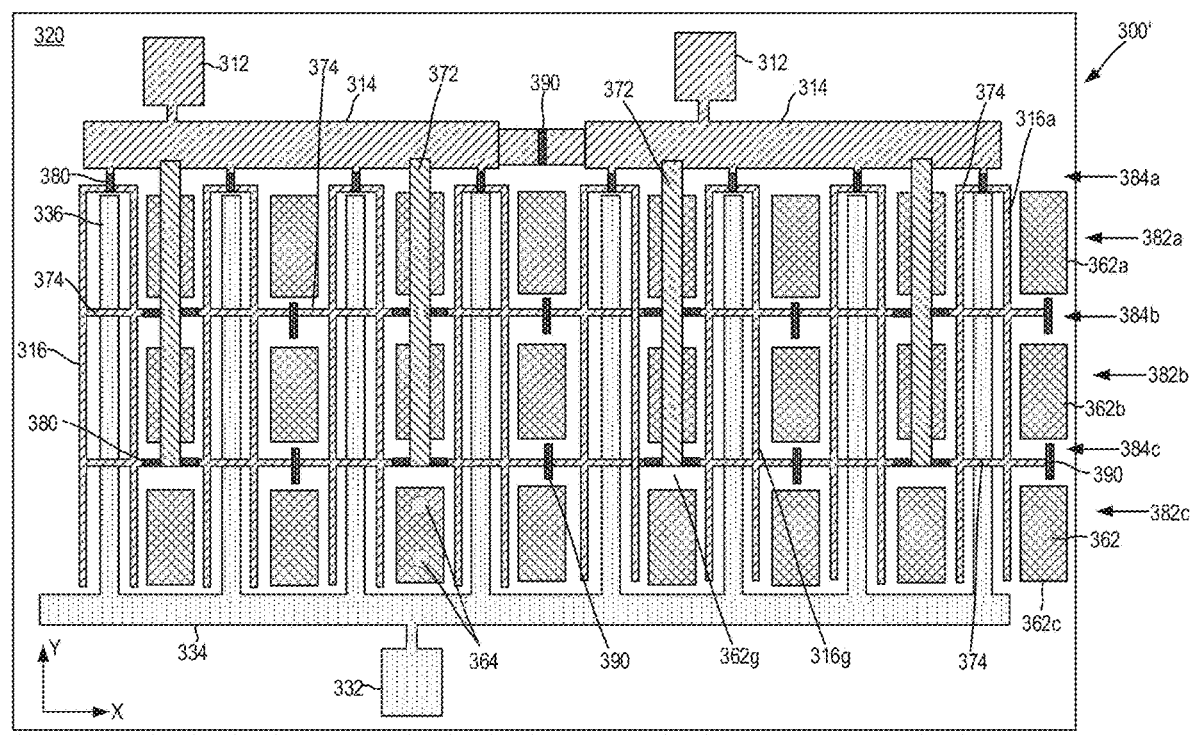
FIG. 15 is a plan view of a metal layout of a transistor in accordance with additional embodiments.

It will be appreciated that features of the above-described embodiments may be combined in any way to create a plurality of additional embodiments. For example, FIG. 14 is a plan view of a metal layout of a transistor 100' that is identical to the transistor 100 described above, except that it has been modified to include series gate resistors 180 that may be identical to the series gate resistors 380 of FIG. 8. As another example, FIG. 15 is a plan view of a metal layout of a transistor 300' that is similar to the transistor 300 described above, except that the gate fingers 316 are no longer segmented, and the location of the series gate resistors 380 are modified accordingly. It will be appreciated that FIGS. 14 and 15 are provided to illustrate a few of the possible combinations of the different embodiments that result in additional embodiments.

Figure 16:
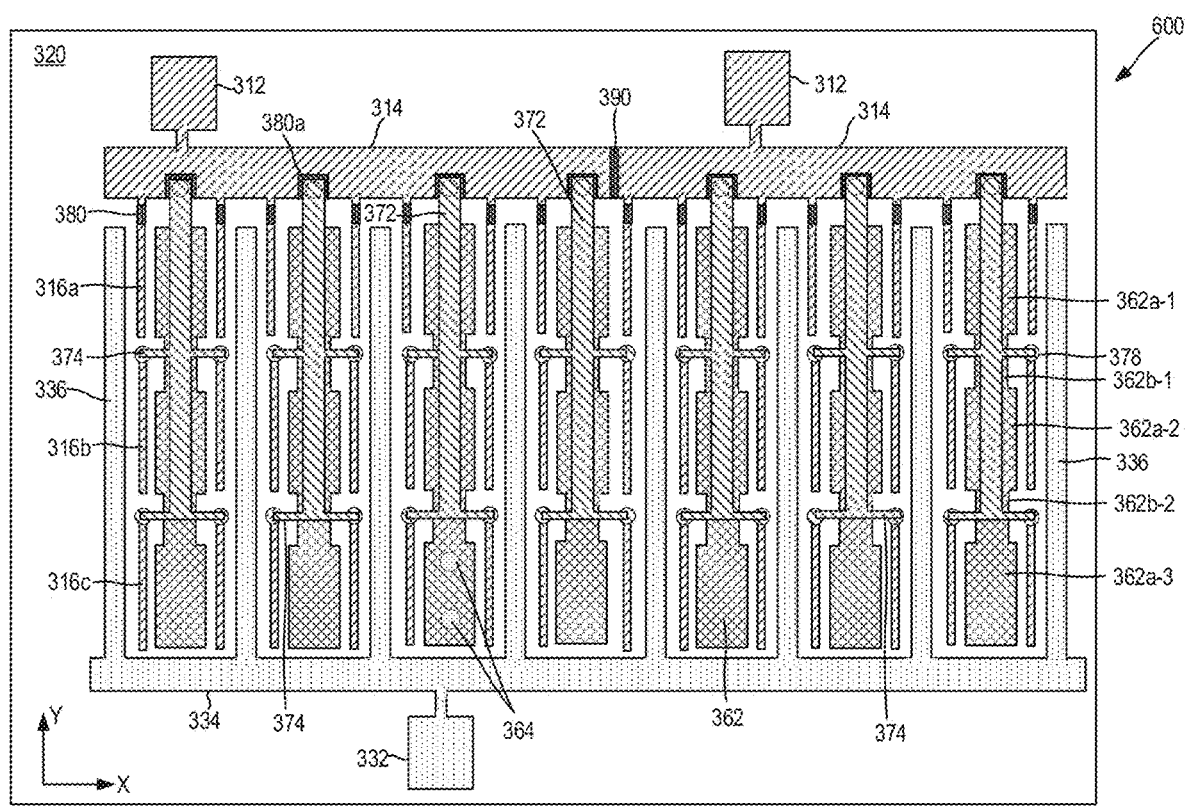
FIGS. 16-22 are plan views of metal layouts of transistors in accordance with stull further embodiments of the present invention.

As discussed above, in some embodiments, the source contacts 362 are not segmented and instead are each implemented as a single continuous source contact 362. FIG. 16 is a plan view of a metal layout of a transistor 600 in accordance with embodiments of the inventive concepts that includes such a configuration. The transistor 600 is similar to the transistor 300 discussed above with reference to FIGS. 8-11, and hence the description below will focus on the differences between the transistor 600 and the transistor 300.

As shown in FIG. 16, each source contact 662 is not segmented and instead is implemented as a single continuous source contact 662. Thus, a length of each source contact 662 in the y-direction may be approximately the same as the length of each drain contact 336 in the y-direction. While, as discussed above, the segmented source contact segments 362a, 362b, 362c that form each source contact 362 of transistor 300 are commonly connected to a source bus layer on the lower side of the semiconductor layer structure 320 through the source vias 364, the electrical path length connecting each source contact segment 362a, 362b, 362c to adjacent source contact segment(s) 362a, 362b, 362c may be relatively long, and parasitic inductances are introduced. As a result, the behavior of the transistor, particularly at operation near and above the "knee" frequency, may be distorted, which can negatively impact the performance, frequency response and/or the stability of the transistor. The parasitic inductances may also make it difficult to accurately model the behavior of the transistor, complicating the design process. The above-discussed undesirable effects may be reduced or eliminated by using continuous source contacts 662 that are not segmented on the upper surface of the semiconductor layer structure 320, as shown in FIG. 16.

Since the source contacts 662 are continuous rather than segmented, less room is provided between the gate splits for additional circuit elements. Consequently, as shown in FIG. 16, the odd mode resistors 390 that are provided in the gaps 362g between the source contact segments 362a, 362b, 362c of transistor 300 are omitted in transistor 600. Similarly, the series gate resistors 380 that were provided in transistor 300 of FIG. 8 for the second and third gate splits (i.e., the gate splits including source contact segments 362b and 362c, respectively) are omitted in transistor 600 and replaced instead with a plurality of series gate resistors 380a that are formed in the gate bus 314 along the electrical path to each respective gate jumper 372. While the series gate resistors 380a are shown formed in the gate bus 314 in FIG. 16, it will be appreciated that the series gate resistors 380a may be formed anywhere along the gate signal paths between the gate bus 314 and the second and subsequent gate splits. For example, in other embodiments, the gate resistors could be formed in conductive vias that connect the gate bus 314 to the respective gate jumpers 372, within the gate signal distribution bars 374 (FIG. 17) or within the gate jumpers 372 (see FIG. 18).

Additionally, in transistor 600, a gate jumper 372 is formed over each and every source contact 662, whereas in transistor 300 a gate jumper 372 was only formed over every other source contact 362. As a result, each gate jumper 372 in transistor 600 only feeds two gate fingers 316, while the gate jumpers 372 in transistor 300 each feed four gate fingers 316. One potential advantage of having each gate jumper 372 only feed two gate fingers 316 is that the gate signal distribution bars 374 need not cross over the drain contacts 336. This may simplify manufacturing, and also may help reduce the parasitic gate-to-drain capacitance. Moreover, by adding the extra gate jumpers 372, the length of the conductive path that each gate signal must traverse to get to the far end of each gate finger 316 may be the same, which is not the case with respect to transistor 300 of FIGS. 8-11. The design of transistor 600 may help reduce phase dispersion issues that result based on differences in the lengths of the gate signal path. Such phase dispersion issues can result in loss of gain, and hence are undesirable.

As discussed above with reference to FIG. 9A, in the transistor 300 the gate signal distribution bars 374 are formed in the same metal layer as the gate jumpers 372. While not visible in the cross-section of FIG. 9A, conductive vias 378 physically and electrically connect each gate signal distribution bar 374 to the respective segments of the discontinuous gate fingers 316, as discussed above with respect to FIGS. 8-11. These conductive vias 378 are shown in FIG. 16. In the transistor 300 of FIG. 8, discontinuous source contacts 362 are used, and thus ample room is provided for the conductive vias 378 within the gaps 362g between adjacent source contact segments 362a, 362b, 362c. In transistor 600, the gaps 362g are not provided (since the source contacts 662 are continuous), and hence there may not be room for the conductive vias 378 while maintaining sufficient tolerances between the conductive vias 378 and other metallization such as the source contacts 662 and the drain contacts 336. Consequently, notches may be formed in each source contact 662 in which the "width" of the source contact is narrowed (i.e., made smaller in the x-direction) as compared to the remainder of the source contact 662. As a result, each source contact 662 may include two or more widened portions 662a, where adjacent widened portions 662a are connected by an intervening narrowed portion 662b. The provision of the narrowed portions 662b generates additional space to make room for the conductive vias 378 that connect each gate distribution bar 374 to a respective gate finger segment 316a, 316b, 316c. The conductive vias 378 are positioned adjacent the narrowed portions 662b of the source contacts 662. Thus, for each of the conductive vias 378, a plane that is perpendicular to a longitudinal axis of its associated gate jumper 372 (i.e., a plane that extends in the x-direction in FIG. 16) and perpendicular to a plane defined by the bottom surface of the semiconductor layer structure 320 (i.e., the plane also extends in the z-direction in FIG. 16) extends through both the conductive via 378 and the narrowed portion 662b of its associated source contact 662.

It will be appreciated that the narrowed portions 662b of the source contacts 662 may be omitted in other embodiments (e.g., when there is sufficient room for the conductive vias 378 without the notches in the source contacts 662).

Thus, as shown in FIG. 16, pursuant to some embodiments of the present invention, transistors 600 are provided that include a semiconductor layer structure 320. A source contact 662, a drain contact 336 and a gate finger 316 are formed on an upper surface of the semiconductor layer structure 320, with the gate finger 316 positioned between the source contact 662 and the drain contact 336. The transistor 600 further comprises a gate jumper 372 that is positioned above and over the source contact 662 and that is electrically connected to at least a portion of the gate finger 316. The source contact 662 extends continuously on the upper surface of the semiconductor layer structure 320 without any gaps that divide the source contact 662 into segments.

In some embodiments, the gate finger 316 comprises a plurality of discontinuous gate finger segments 316a, 316b, 316c. The transistor may further comprise a gate bus 314, where at least one of the discontinuous gate finger segments 316a, 316b, 316c is electrically connected to the gate bus 314 through the gate jumper 372. The source contact 662 may include at least a first widened portion 662a-1, a second widened portion 662a-2 and a narrowed portion 662b that physically and electrically connects the first widened portion 662a-1 to the second widened portion 662a-2. The first and second widened portions 662a-1, 662a-2 may be wider than the narrowed portion 662b-1 in a direction that is perpendicular to a longitudinal axis of the source contact 662 and that is parallel to a lower surface of the semiconductor layer structure 320 (i.e., in the x-direction in FIG. 16).

The transistor 600 may further include a gate signal distribution bar 374 that is at a same height above the semiconductor layer structure 320 as the gate jumper 372. The gate signal distribution bar 374 may extend from the gate jumper 372 towards the gate finger 316, and may be interposed on an electrical path between the gate jumper 372 and at least a portion of the gate finger 316. The gate signal distribution bar 374 may be electrically connected to the gate finger 316 by a conductive via 378. A series gate resistor 380a may be interposed on an electrical path that connects the gate bus 314 to the gate signal distribution bar 374. Moreover, a longitudinal axis of the source contact 662, a longitudinal axis of the drain contact 336 and a longitudinal axis of the gate finger 316 may each extend in the first direction (the y-direction in FIG. 16).

As is also shown in FIG. 16, pursuant to further embodiments of the present invention, transistors are provided that include a semiconductor layer structure 320 and a source contact 662, a drain contact 336 and a gate finger 316 that are formed on an upper surface of the semiconductor layer structure 320, with the gate finger 316 positioned between the source contact 662 and the drain contact 336. The source contact 662 includes first and second widened portions 662a-1, 662a-2 that are physically and electrically connected to each other by a narrowed portion 662b. The first and second widened portions 662a-1, 662a-2 may be wider than the narrowed portion 662b in a direction that is perpendicular to a longitudinal axis of the source contact 662 and that is parallel to a lower surface of the semiconductor layer structure 320 (i.e., in the x-direction). The transistor may further include a gate bus 314 and a gate jumper 372 that is electrically connected to the gate bus 314, and the gate jumper 372 may be positioned above and over the source contact 662. At least a portion of the gate finger 316 may be electrically connected to the gate bus 314 through the gate jumper 372.

As can also be seen from FIG. 16, pursuant to still further embodiments of the present invention, transistors are provided that include a semiconductor layer structure 320, a source contact 662, a drain contact 336 and a gate finger 316 that comprises a plurality of discontinuous gate finger segments 316a, 316b, 316c. The source contact 662, the drain contact 336 and the gate finger 316 each extend in a first direction (the x-direction) on an upper surface of the semiconductor layer structure 320, with the gate finger 316 positioned between the source contact 662 and the drain contact 336. The transistor further comprises a gate bus 314 and a gate jumper 372 that is electrically connected to the gate bus 314, where the gate jumper 372 has a longitudinal axis that extends in the first direction and is positioned above and over the source contact 662. The transistor also includes a gate signal distribution bar 374 in a same metal layer as the gate jumper 372, the gate signal distribution bar 374 extending from the gate jumper 372 towards a first of the discontinuous gate finger segments 316b.

While FIG. 16 illustrates a transistor 600 that includes three gate splits, it will be appreciated that embodiments of the present invention are not limited thereto. For example, in other embodiments, the transistor 600 may only include two gate splits or may include four or more gate splits.

Figure 17:
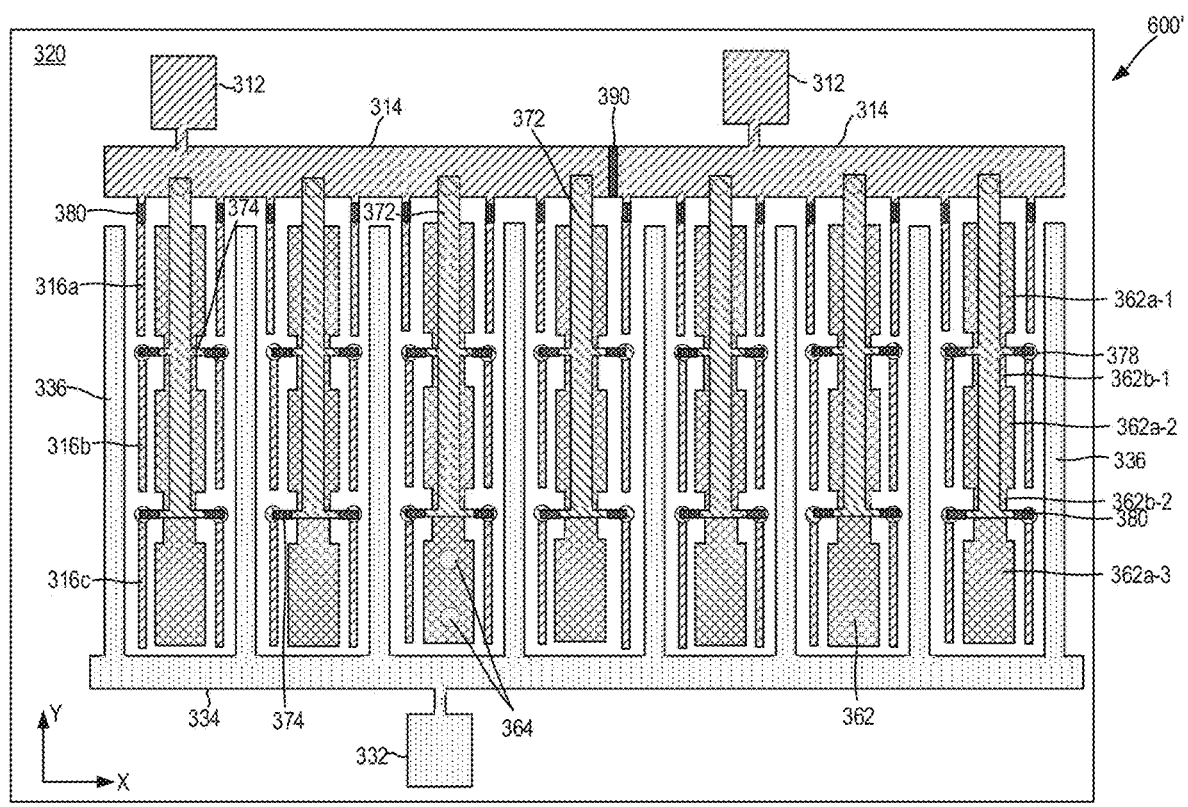

FIG. 17 is a plan view of a metal layout of a transistor 600' in accordance with embodiments of the inventive concepts that is a modified version of the transistor 600 of FIG. 16. The transistor 600' may be identical to the transistor 600, except that the transistor 600' includes series gate resistors 380 along all three gate splits, and omits the series gate resistors 380a that were added in transistor 600. In the embodiment of FIG. 17, the series gate resistors 380 are implemented in the gate signal distribution bars 374, similar to the embodiments depicted in FIGS. 14 and 15. In other embodiments, the series gate resistors 380 may instead be implemented within the gate finger segments 316b, 316c or within the conductive vias 378 that connect the gate signal distribution bars 374 to the gate finger segments 316b, 316c. Since aside from this change the two transistors 600, 600' may otherwise be essentially identical, further discussion of the transistor 600' will be omitted.

Figure 18:
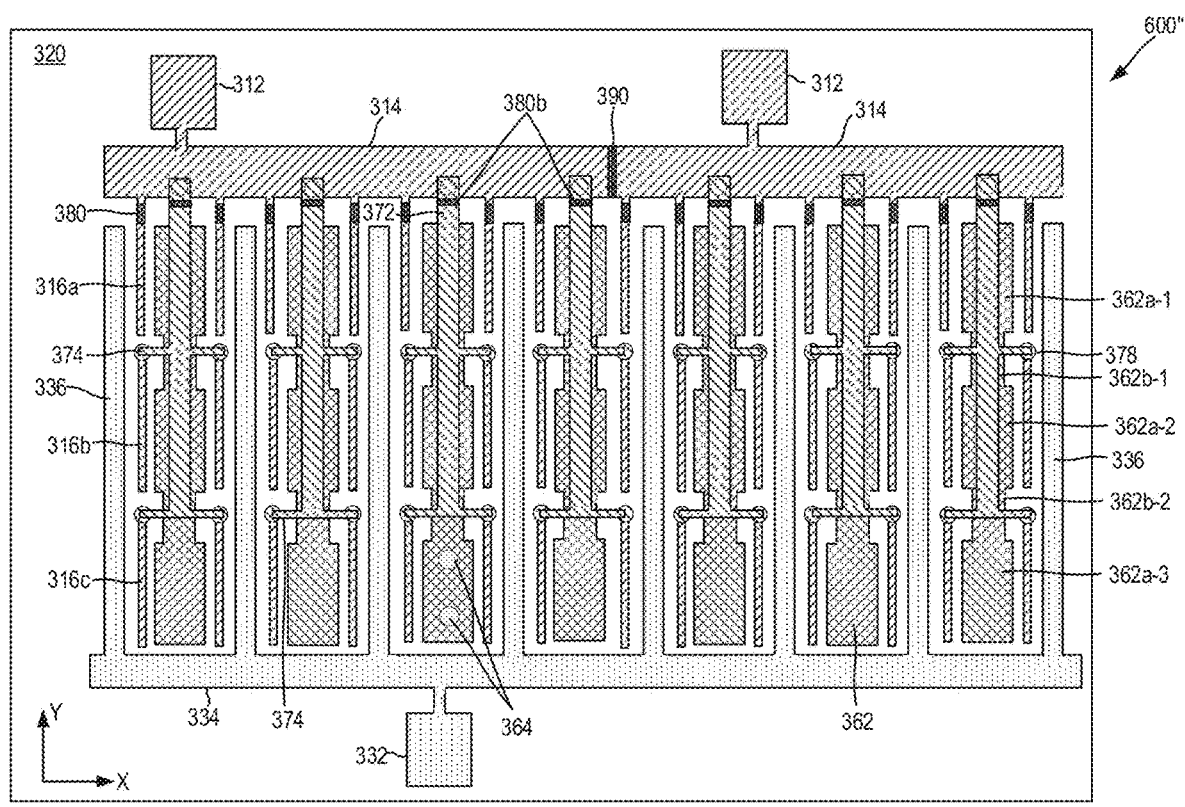

FIG. 18 is a plan view of a metal layout of a transistor 600" in accordance with embodiments of the inventive concepts that is another modified version of the transistor 600 of FIG. 16. The transistor 600" may be identical to the transistor 600, except that the transistor 600" includes series gate resistors 380b that are implemented along each gate jumper 372, and omits the series gate resistors 380a that were added in transistor 600. Since aside from this change the two transistors 600, 600" may otherwise be essentially identical, further discussion of the transistor 600" will be omitted.

Figure 19:
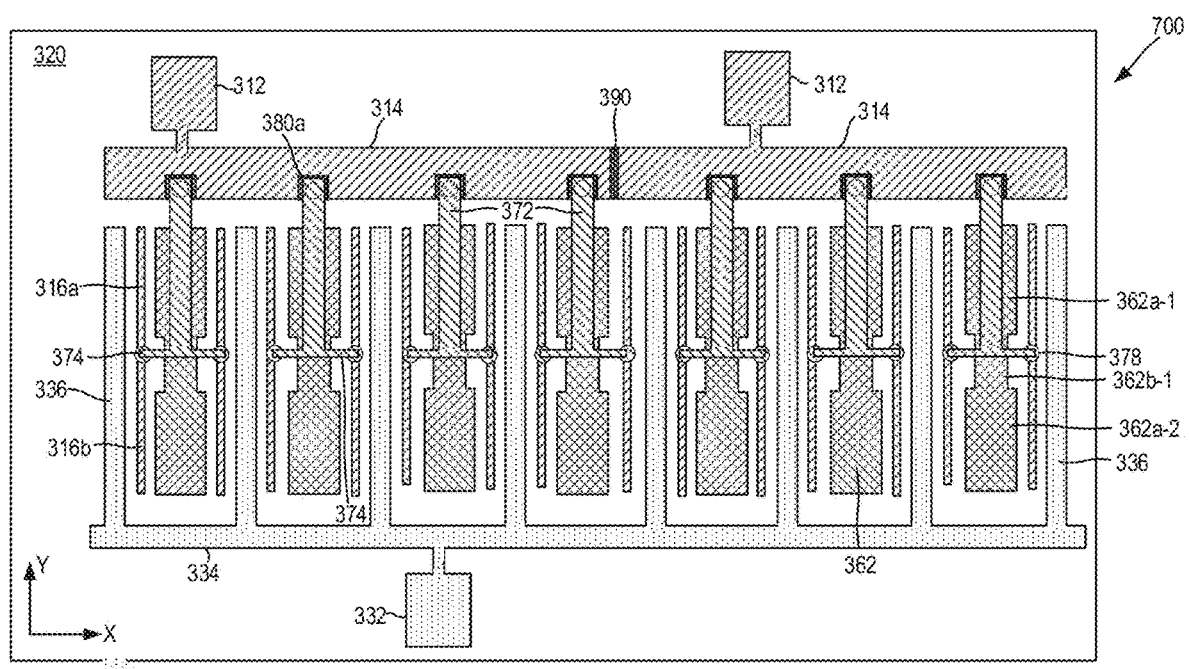

FIG. 19 is a plan view of a metal layout of a transistor 700 in accordance with still further embodiments of the inventive concepts. The transistor 700 is similar to the transistor 600 of FIG. 16, but includes several notable differences. First, the transistor 700 only includes two gate splits instead of the three gate splits included in transistor 600. Additionally, transistor 700 includes continuous gate fingers 316 instead of gate fingers that are divided into multiple discontinuous segments 316a, 316b, 316c as is done in transistor 600. Finally, the direct connections between the gate buses 314 and the ends of the gate fingers 316 that are adjacent the gate buses 314 are omitted in transistor 700, as are the series gate resistors 380 that were interposed along these direct connections in transistor 600. As a result, each gate finger 316 is center-fed through one of the gate jumpers 372. This design may be advantageous as it may further reduce phase dispersion in that the phase difference between the gate signal applied at the center of each gate finger 316 and the gate signal applied at the ends of each gate finger 316 is further reduced. This may result in increased gain.

Figure 20:
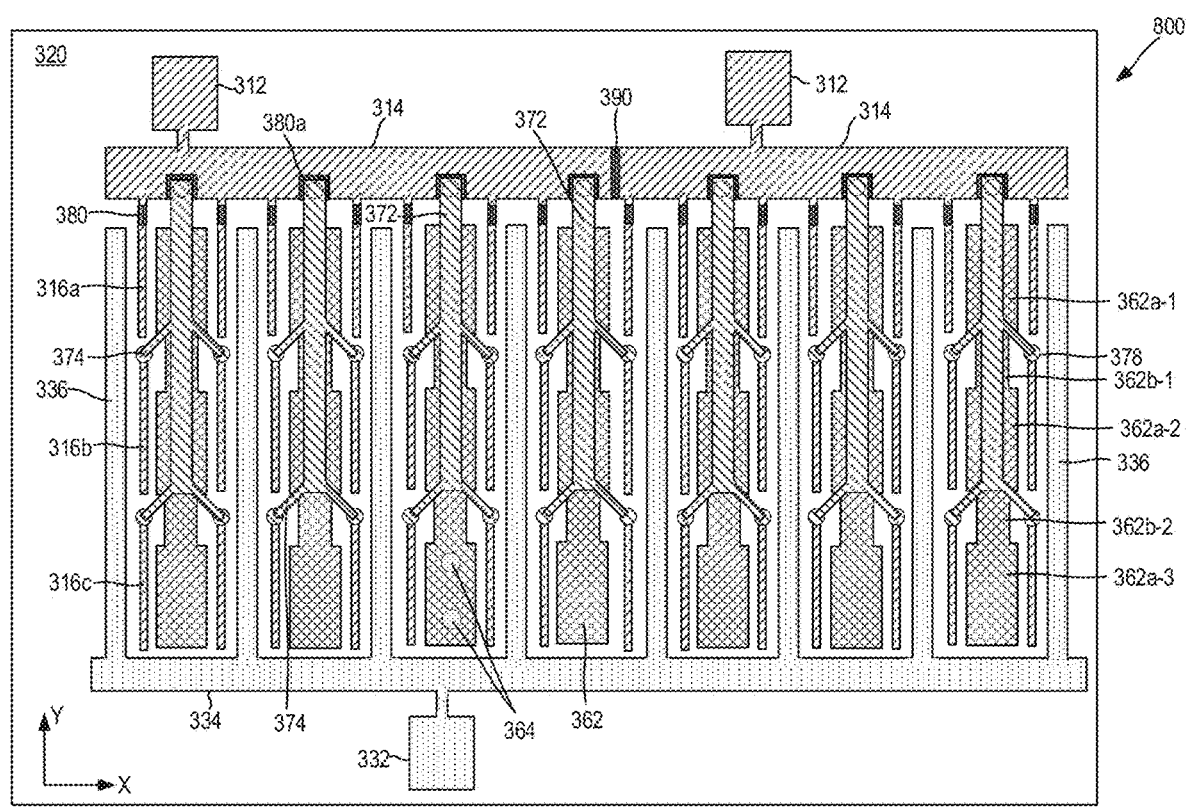

FIG. 20 is a plan view of a metal layout of a transistor 800 in accordance with still further embodiments of the inventive concepts. The transistor 800 is similar to the transistor 600 of FIG. 16, but the gate distribution bars 374 in transistor 800 are disposed at angles of about 45° with respect to the longitudinal axes of the respective gate jumpers 372 instead of being set at right angles with respect to the longitudinal axes of the respective gate jumpers 372 as shown in the other embodiments described above. This approach may advantageously shorten the gate signal path. Any of the embodiments disclosed herein may be modified to have gate signal distribution bars 374 that are arranged at angles other than 90° with respect to the longitudinal axes of the respective gate jumpers 372 (i.e., the gate signal distribution bars 374 are arranged at oblique angles with respect to the longitudinal axes of the respective gate jumpers 372).

It will also be appreciated that in other embodiments segmented source contacts may be used such as the source contacts 362 in the transistor 300 of FIGS. 8-11, and a separate electrical connection may be provided on the upper surface of the semiconductor layer structure 320 that electrically connects the discontinuous source contact segments 362a, 362b, 362c on the top side of the semiconductor layer structure 320. For example, source connector segments could be implemented in the same metal layer as the gate jumpers 372 or in a different metal layer (either higher or lower) than the gate jumpers 372. These source connector segments could be electrically connected to the discontinuous source contact segments 362a, 362b, 362c through conductive vias.

Figure 21:
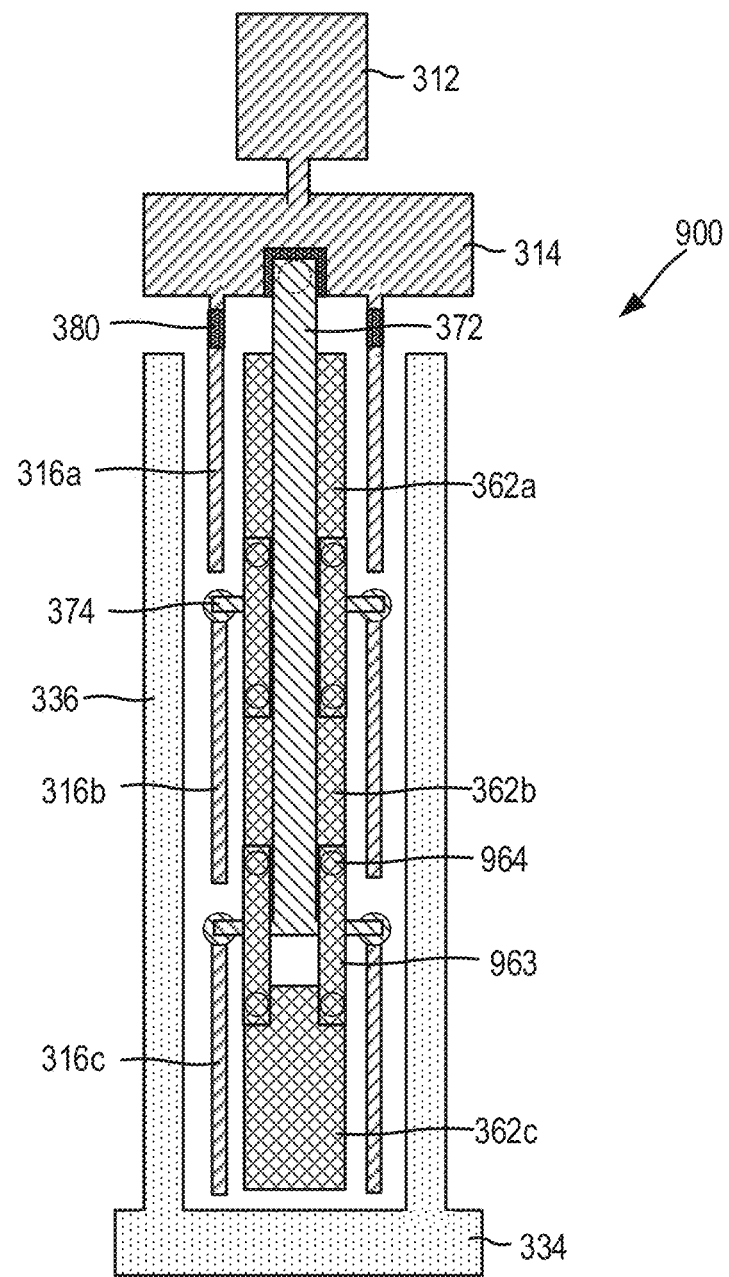

FIG. 21 is a plan view of a small portion of a metal layout of a transistor 900 that includes such source connector segments. As shown in FIG. 21, the transistor 900 includes a discontinuous source contact 362 that includes three source contact segments 362a, 362b, 362c. Source connector segments 963 are also provided that are implemented in a metal layer that is above (i.e., higher above the semiconductor layer structure) than the metal layer that includes the gate jumpers 372. Conductive vias 964 electrically connect each source connector segment 963 to an underlying source contact segment 362a, 362b, 362c.

Figure 22:
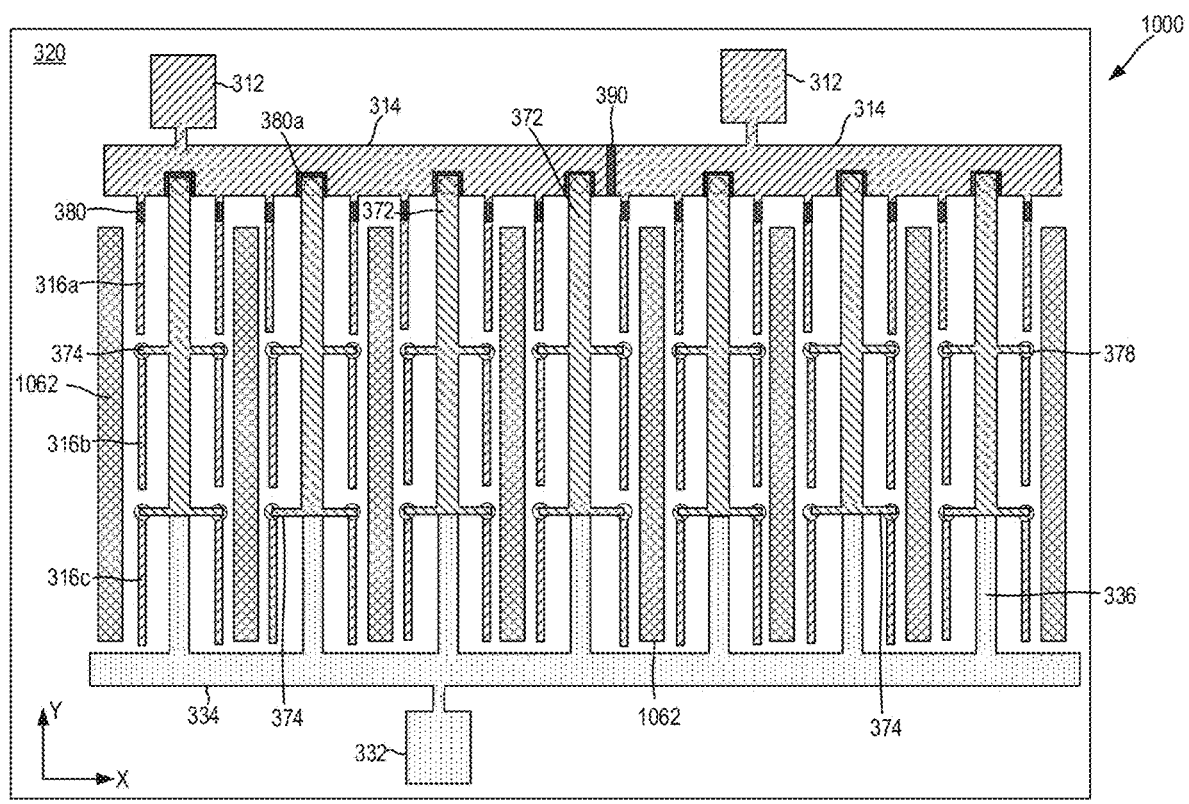

While the embodiments illustrated in the preceding figures position the gate jumpers 372 to run over and above the respective source contacts 362/662, as noted above, embodiments of the present invention are not limited thereto. FIG. 22 is a plan view of a metal layout of a transistor 1000 in accordance with still further embodiments of the inventive concepts in which the gate jumpers 372 run over and above the drain contacts 336. It will be appreciated that each drain contact 336 extends almost to the gate buses 314, but most of each drain contact 336 is covered by the respective gate jumpers 372 and hence only about one-third of each drain contact 336 is visible in FIG. 22. In the depicted embodiment, both the drain contacts 336 and the source contacts 1062 are implemented as continuous contacts that do not have any notches (narrowed portions) formed therein. It will be appreciated that in other embodiments, the source contacts 1062 may be replaced with discontinuous source contacts such as source contacts 362 of FIG. 8 or with continuous source contacts that have notches such as source contacts 662 of FIG. 16.

Embodiments of the inventive concepts may be particularly well suited for use in connection with Group III-nitride based high electron mobility transistor (HEMT) devices. As used herein, the term "Group III nitride" refers to those semiconducting compounds formed between nitrogen and the elements in Group III of the periodic table, usually aluminum (Al), gallium (Ga), and/or indium (In). The term also refers to ternary and quaternary compounds such as AlGaN and AlInGaN. These compounds all have empirical formulas in which one mole of nitrogen is combined with a total of one mole of the Group III elements.

Suitable structures for GaN-based HEMTs that may utilize embodiments of the present invention are described, for example, in commonly assigned U.S. Publication No. 2002/0066908A1 published Jun. 6, 2002, for "Aluminum Gallium Nitride/Gallium Nitride High Electron Mobility Transistors Having A Gate Contact On A Gallium Nitride Based Cap Segment And Methods Of Fabricating Same," U.S. Publication No. 2002/0167023A1 for "Group-III Nitride Based High Electron Mobility Transistor (HEMT) With Barrier/Spacer Layer," published Nov. 14, 2002, U.S. Publication No. 2004/0061129 for "Nitride-Based Transistors And Methods Of Fabrication Thereof Using Non-Etched Contact Recesses," published on Apr. 1, 2004, U.S. Pat. No. 7,906,799 for "Nitride-Based Transistors With A Protective Layer And A Low-Damage Recess" issued Mar. 15, 2011, and U.S. Pat. No. 6,316,793 entitled "Nitride Based Transistors On Semi-Insulating Silicon Carbide Substrates," issued Nov. 13, 2001, the disclosures of which are hereby incorporated herein by reference in their entirety.

In particular embodiments of the present invention, the substrate 200 may be a semi-insulating silicon carbide (SiC) substrate that may be, for example, 4H polytype of silicon carbide. Other silicon carbide candidate polytypes include the 3C, 6H, and 15R polytypes.

Optional buffer, nucleation and/or transition layers (not shown) may be provided on the substrate 200 beneath the channel layer 210. For example, an AlN buffer layer may be included to provide an appropriate crystal structure transition between the silicon carbide substrate and the remainder of the device. Additionally, strain balancing transition layer(s) may also be provided as described, for example, in commonly assigned U.S. Publication 2003/0102482A1, published Jun. 5, 2003, and entitled "Strain Balanced Nitride Hetrojunction Transistors And Methods Of Fabricating Strain Balanced Nitride Heterojunction Transistors," the disclosure of which is incorporated herein by reference as if set forth fully herein. Moreover, one or more capping layers, such as SiN capping layers, may be provided on the barrier layer 220.

Silicon carbide has a much closer crystal lattice match to Group III nitrides than does sapphire ($Al_2O_3$), which is a very common substrate material for Group III nitride devices. The closer lattice match of SiC may result in Group III nitride films of higher quality than those generally available on sapphire. Silicon carbide also has a very high thermal conductivity so that the total output power of Group III nitride devices on silicon carbide is, typically, not as limited by thermal dissipation of the substrate as in the case of the same devices formed on sapphire. Also, the availability of semi-insulating silicon carbide substrates may provide for device isolation and reduced parasitic capacitance. Appropriate SiC substrates are manufactured by, for example, Cree, Inc., of Durham, N.C., the assignee of the present invention.

Although silicon carbide may be used as a substrate material, embodiments of the present invention may utilize any suitable substrate, such as sapphire, aluminum nitride, aluminum gallium nitride, gallium nitride, silicon, GaAs, LGO, ZnO, LAO, InP and the like. In some embodiments, an appropriate buffer layer also may be formed.

In some embodiments of the present invention, the channel layer 210 is a Group III-nitride, such as $Al_xGa_{1-x}N$ where $0 \leq x < 1$, provided that the energy of the conduction band edge of the channel layer 210 is less than the energy of the conduction band edge of the barrier layer 220 at the interface between the channel and barrier layers. In certain embodiments of the present invention, x=0, indicating that the channel layer 210 is GaN. The channel layer 210 may also be other Group III-nitrides such as InGaN, AlInGaN or the like. The channel layer 210 may be undoped or unintentionally doped and may be grown to a thickness of greater than about 20 Å. The channel layer 210 may also be a multi-layer structure, such as a superlattice or combinations of GaN, AlGaN or the like.

The channel layer 210 may have a bandgap that is less than the bandgap of the barrier layer 220, and the channel layer 210 may also have a larger electron affinity than the barrier layer 220. In certain embodiments of the inventive concepts, the barrier layer 220 is AlN, AlInN, AlGaN or AlInGaN with a thickness of between about 0.1 nm and about 10 nm. In particular embodiments of the inventive concepts, the barrier layer 22 is thick enough and has a high enough Al composition and doping to induce a significant carrier concentration at the interface between the channel layer 210 and the barrier layer 220.

The barrier layer 220 may be a Group III-nitride and has a bandgap larger than that of the channel layer 210 and a smaller electron affinity than the channel layer 210. Accordingly, in certain embodiments of the present invention, the barrier layer 220 may include AlGaN, AlInGaN and/or AlN or combinations of layers thereof. The barrier layer 220 may, for example, be from about 0.1 nm to about 30 nm thick. In certain embodiments of the present invention, the barrier layer 220 is undoped or doped with an n-type dopant to a concentration less than about $10^{19}$ $cm^{-3}$. In some embodiments of the present invention, the barrier layer 220 is $Al_xGa_{1-x}N$ where $0<x<1$. In particular embodiments, the aluminum concentration is about 25%. However, in other embodiments of the present invention, the barrier layer 220 comprises AlGaN with an aluminum concentration of between about 5% and about 100%. In specific embodiments of the present invention, the aluminum concentration is greater than about 10%.

While embodiments of the present invention are illustrated with reference to a GaN High Electron Mobility Transistor (HEMT) structure, the present inventive concepts are not limited to such devices. Thus, embodiments of the present invention may include other transistor devices having a plurality of unit cells and a controlling electrode. Embodiments of the present invention may be suitable for use in any semiconductor device where a wider controlling electrode is desired and multiple unit cells of the device are present. Thus, for example, embodiments of the present invention may be suitable for use in various types of devices, such as, MESFETs, MMICs, SITs, LDMOS, BJTs, pHEMTs, etc., fabricated using SiC, GaN, GaAs, silicon, etc.

It will be understood that, although the terms first, second, etc. may be used herein to describe various elements, these elements should not be limited by these terms. These terms are only used to distinguish one element from another. For example, a first element could be termed a second element, and, similarly, a second element could be termed a first element, without departing from the scope of the present invention. As used herein, the term "and/or" includes any and all combinations of one or more of the associated listed items.

The terminology used herein is for the purpose of describing particular embodiments only and is not intended to be limiting of the invention. As used herein, the singular forms "a," "an" and "the" are intended to include the plural forms as well, unless the context clearly indicates otherwise. It will be further understood that the terms "comprises" "comprising," "includes" and/or "including" when used herein, specify the presence of stated features, integers, steps, operations, elements, and/or components, but do not preclude the presence or addition of one or more other features, integers, steps, operations, elements, components, and/or groups thereof.

Unless otherwise defined, all terms (including technical and scientific terms) used herein have the same meaning as commonly understood by one of ordinary skill in the art to which this invention belongs. It will be further understood that terms used herein should be interpreted as having a meaning that is consistent with their meaning in the context of this specification and the relevant art and will not be interpreted in an idealized or overly formal sense unless expressly so defined herein.

It will be understood that when an element such as a layer, region or substrate is referred to as being "on" or extending "onto" another element, it can be directly on or extend directly onto the other element or intervening elements may also be present. In contrast, when an element is referred to as being "directly on" or extending "directly onto" another element, there are no intervening elements present. It will also be understood that when an element is referred to as being "connected" or "coupled" to another element, it can be directly connected or coupled to the other element or intervening elements may be present. In contrast, when an element is referred to as being "directly connected" or "directly coupled" to another element, there are no intervening elements present.

Relative terms such as "below" or "above" or "upper" or "lower" or "horizontal" or "lateral" or "vertical" may be used herein to describe a relationship of one element, layer or region to another element, layer or region as illustrated in the figures. It will be understood that these terms are intended to encompass different orientations of the device in addition to the orientation depicted in the figures.

Embodiments of the invention are described herein with reference to cross-section illustrations that are schematic illustrations of idealized embodiments (and intermediate structures) of the invention. The thickness of layers and regions in the drawings may be exaggerated for clarity. Additionally, variations from the shapes of the illustrations as a result, for example, of manufacturing techniques and/or tolerances, are to be expected. Thus, embodiments of the invention should not be construed as limited to the particular shapes of regions illustrated herein but are to include deviations in shapes that result, for example, from manufacturing.

In the drawings and specification, there have been disclosed typical embodiments of the invention and, although specific terms are employed, they are used in a generic and descriptive sense only and not for purposes of limitation, the scope of the invention being set forth in the following claims.

What is claimed is:

1. A transistor device comprising: a semiconductor layer structure;
a source contact on an upper surface of the semiconductor layer structure;
a drain contact on the upper surface of the semiconductor layer structure;
a gate finger on the upper surface of the semiconductor layer structure, the gate finger positioned between the source contact and the drain contact; and
a gate jumper that is electrically connected to at least a portion of the gate finger, the gate jumper positioned above and over the source contact,
wherein the source contact extends continuously on the upper surface of the semiconductor layer structure without any gaps that divide the source contact into segments;
wherein a longitudinal axis of the source contact, a longitudinal axis of the drain contact and a longitudinal axis of the gate finger each extend in the first direction, and
wherein a longitudinal axis of the gate jumper is parallel to the longitudinal axis of the source contact.

2. The transistor device of claim 1, wherein the gate finger comprises a plurality of discontinuous gate finger segments.

3. The transistor device of claim 2, further comprising a gate bus, wherein at least one of the discontinuous gate finger segments is electrically connected to the gate bus through the gate jumper.

4. The transistor device of claim 2, further comprising a gate signal distribution bar that is at a same height above the semiconductor layer structure as the gate jumper, the gate signal distribution bar extending from the gate jumper towards the gate finger.

5. The transistor device of claim 4, wherein the gate signal distribution bar is interposed on an electrical path between the gate jumper and at least a portion of the gate finger.

6. The transistor device of claim 1, wherein the source contact is on a first major surface of the semiconductor layer structure, the transistor device further comprising:
a source bus layer on a second major surface of the semiconductor layer structure; and
a plurality of source contact plugs that extend through the semiconductor layer structure to electrically connect the source contact to the source bus layer.

7. The transistor device of claim 6, wherein the source contact includes at least a first widened portion, a second widened portion and a narrowed portion that physically and electrically connects the first widened portion to the second widened portion.

8. A transistor device comprising:
a semiconductor layer structure;
a source contact that extends in a first direction on an upper surface of the semiconductor layer structure;
a drain contact that extends in the first direction on the upper surface of the semiconductor layer structure;
a gate finger that extends in the first direction on the upper surface of the semiconductor layer structure, the gate finger positioned between the source contact and the drain contact, wherein the gate finger comprises a plurality of discontinuous gate finger segments;

wherein one of the source contact and the drain contact comprises, on the upper surface of the semiconductor layer structure, a first widened portion, a second widened portion and a narrowed portion that is in between the first widened portion and the second widened portion, and wherein the first widened portion, the second widened portion and the narrowed portion are each positioned in between the gate finger and the other of the source contact and the drain contact and overlap the gate finger and the other of the source contact and the drain contact in a first direction that is perpendicular to a longitudinal axis of the source contact and that is parallel to a lower surface of the semiconductor layer structure and wherein a first of the discontinuous gate finger segments is electrically connected to the gate bus through a series gate resistor and is not electrically connected to the gate bus through the gate jumper.

9. The transistor device of claim 8, wherein the one of the source contact and the drain contact is the source contact.

10. The transistor device of claim 8, wherein the first and second widened portions are wider than the narrowed portion in the first direction.

11. The transistor device of claim 8, further comprising a gate bus and a gate jumper that is electrically connected to the gate bus, wherein the gate jumper is positioned above and over one of the source contact and the drain contact, and wherein at least a portion of the gate finger is electrically connected to the gate bus through the gate jumper.

12. The transistor device of claim 11, further comprising a gate signal distribution bar that is formed in a same metal layer as the gate jumper, the gate signal distribution bar extending from the gate jumper towards the gate finger.

13. The transistor device of claim 12, wherein the gate signal distribution bar is electrically connected to at least a portion of the gate finger by a conductive via.

14. The transistor device of claim 13, wherein a plane that is perpendicular to a longitudinal axis of the gate jumper and perpendicular to a plane defined by a bottom surface of the semiconductor layer structure extends through both the narrowed portion of the source contact and the conductive via.

15. The transistor device of claim 11, further comprising a conductive via that is in between the narrowed portion of the one of the source contact and drain contact and the other of the source contact and drain contact when the transistor device is viewed from above.

16. A transistor device comprising: a semiconductor layer structure;
 a source contact that extends in a first direction on an upper surface of the semiconductor layer structure;
 a drain contact that extends in the first direction on the upper surface of the semiconductor layer structure;
 a gate finger that extends in the first direction on the upper surface of the semiconductor layer structure, the gate finger positioned between the source contact and the drain contact and comprising a plurality of discontinuous gate finger segments;
 a gate bus;
 a gate jumper that is electrically connected to the gate bus, wherein the gate jumper has a longitudinal axis that extends in the first direction and is positioned above the source contact; and
 a gate signal distribution bar that is formed in a same metal layer as the gate jumper, the gate signal distribution bar extending from the gate jumper towards a first of the discontinuous gate finger segments,
 wherein the gate signal distribution bar is electrically connected to the first of the discontinuous gate finger segments by a conductive via.

17. The transistor device of claim 16, wherein the source contact includes, on the upper surface of the semiconductor layer structure, first and second widened sections that are physically and electrically connected to each other by a narrowed section, and wherein the gate jumper is positioned above the source contact and a first of the discontinuous gate finger segments is electrically connected to the gate bus through the gate jumper.

18. The transistor device of claim 16, wherein a plane that is perpendicular to a longitudinal axis of the gate jumper and perpendicular to a plane defined by a bottom surface of the semiconductor layer structure extends through both the narrowed section of the source contact and the conductive via.

* * * * *